United States Patent
Kandel

(10) Patent No.: US 11,658,250 B2
(45) Date of Patent: May 23, 2023

(54) METAL-OXIDE SEMICONDUCTOR (MOS) CAPACITOR (MOSCAP) CIRCUITS AND MOS DEVICE ARRAY BULK TIE CELLS FOR INCREASING MOS DEVICE ARRAY DENSITY

(71) Applicant: QUALCOMM Incorporated, San Diego, CA (US)

(72) Inventor: Bed Raj Kandel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 305 days.

(21) Appl. No.: 17/088,141

(22) Filed: Nov. 3, 2020

(65) Prior Publication Data

US 2022/0140153 A1 May 5, 2022

(51) Int. Cl.
*H01L 29/94* (2006.01)
*H01L 23/528* (2006.01)
(Continued)

(52) U.S. Cl.
CPC ............ *H01L 29/94* (2013.01); *H01L 23/528* (2013.01); *H01L 27/101* (2013.01); *H01L 27/105* (2013.01); *H01L 29/0696* (2013.01)

(58) Field of Classification Search
CPC ..... H01L 29/94; H01L 23/528; H01L 27/101; H01L 27/105; H01L 29/0696; H01L 21/823475; H01L 21/823481; H01L 21/823871; H01L 21/823878; H01L 27/0629; H01L 27/088; H01L 27/092; H01L 27/0207
(Continued)

(56) References Cited

U.S. PATENT DOCUMENTS 6,265,778 B1 * 7/2001 Tottori ................ H01L 23/5283
257/E23.152
7,375,874 B1 * 5/2008 Novotny ............. B81C 1/00238
438/50
(Continued)

OTHER PUBLICATIONS

International Search Report and Written Opinion for International Patent Application No. PCT/US2021/050323, dated Apr. 12, 2022, 17 pages.
(Continued)

*Primary Examiner* — Duy T Nguyen
(74) *Attorney, Agent, or Firm* — Qualcomm Incorporated

(57) ABSTRACT

High-density metal-oxide semiconductor (MOS) capacitor (MOSCAP) cell circuits and MOS device array circuits are disclosed. A gate comprising a selected aspect ratio disposed in a MOSCAP cell circuit comprising a cell region is configured to increase a capacitive density by increasing an extent to which metal routing layers contribute to a total MOSCAP cell circuit capacitance. An area of a MOSCAP array circuit is also reduced. Also, bulk tie cells are disposed within a MOS device array circuit in array diffusion regions to increased MOS device array circuit density. The array diffusion regions include a first device region including MOS devices and a bulk tie region including the bulk tie cells. The bulk tie region is isolated from the first device region by a diffusion cut. A diffusion cut is between a first gate on the device region and a second gate on the bulk tie region.

26 Claims, 12 Drawing Sheets

(51) Int. Cl.
  *H01L 27/10* (2006.01)
  *H01L 27/105* (2023.01)
  *H01L 29/06* (2006.01)

(58) Field of Classification Search
  USPC .......................................... 257/313
  See application file for complete search history.

(56) References Cited

U.S. PATENT DOCUMENTS

| | | | | |
|---|---|---|---|---|
| 2004/0164354 | A1* | 8/2004 | Mergens | H01L 29/4975 |
| | | | | 257/E29.026 |
| 2009/0302422 | A1* | 12/2009 | Kanari | H01L 27/0207 |
| | | | | 257/532 |
| 2014/0035001 | A1* | 2/2014 | Czornomaz | H01L 29/66181 |
| | | | | 257/192 |
| 2015/0262624 | A1* | 9/2015 | Zaitsu | G11C 5/063 |
| | | | | 365/72 |

OTHER PUBLICATIONS

Invitation to Pay Additional Fees and Partial International Search for International Patent Application No. PCT/US2021/050323, dated Jan. 5, 2022, 9 pages.

* cited by examiner

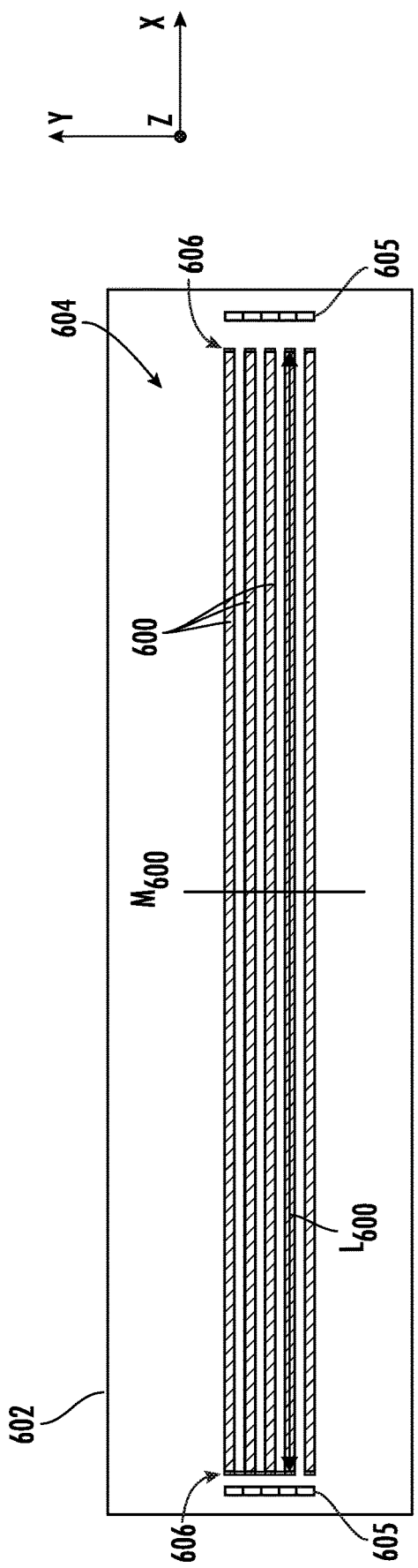
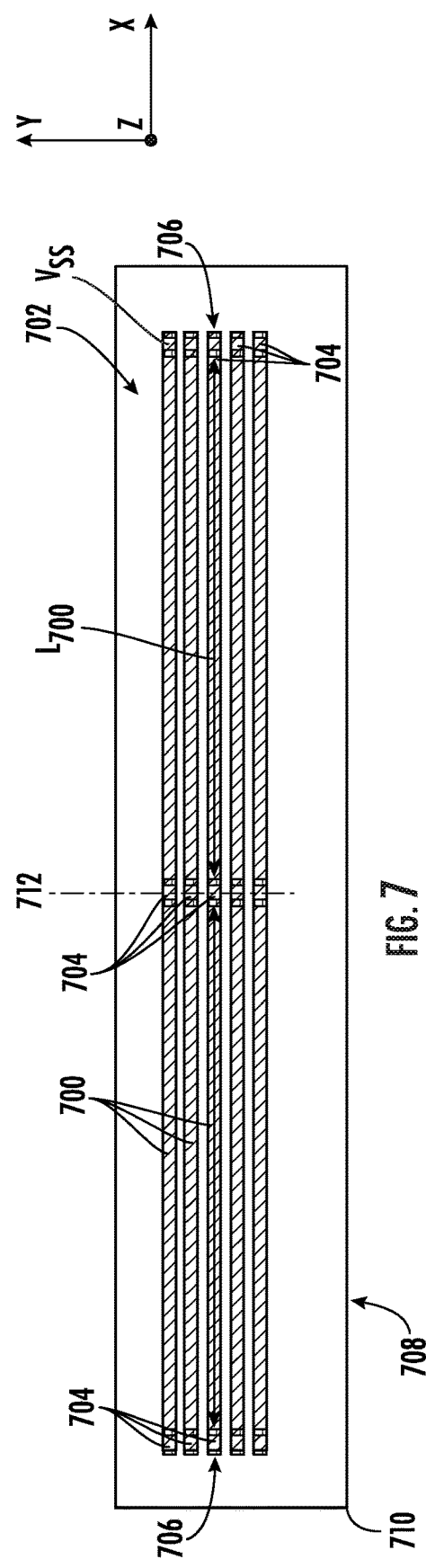
FIG. 6
FIG. 7

METAL-OXIDE SEMICONDUCTOR (MOS) CAPACITOR (MOSCAP) CIRCUITS AND MOS DEVICE ARRAY BULK TIE CELLS FOR INCREASING MOS DEVICE ARRAY DENSITY

BACKGROUND

I. Field of the Disclosure

The field of the disclosure relates generally to integrated circuits (ICs) and more specifically to metal-oxide semiconductor (MOS) devices and arrays of MOS devices in an IC.

II. Background

Consumer electronic devices trend toward higher performance and lower cost. According, the circuit technologies on which electronic devices are based must also reflect these trends. Improvements in both performance and cost can be gained by reducing the number of devices in an integrated circuit (IC) package. For example, in an IC package, passive devices such as capacitors are often provided on a separate substrate from an IC die containing transistors. Some methods for incorporating capacitors into an IC chip increase routing congestion in metal interconnect layers and caused some regions of the semiconductor to be unavailable for locating transistors. Since performance and cost of an IC chip are also improved by minimizing a total area of an IC, the area wasted by including such internal capacitors provides limited benefits. Currently, capacitors can be formed within an IC by taking advantage of existing metal-oxide semiconductor (MOS) technologies used to create MOS field-effect transistors (MOSFETS). The source and drain terminals of a MOS transistor are electrically coupled to each other such that the active/diffusion region of the semiconductor forms a first side of a plate capacitor instead of a transistor channel for passing current. A second side of the capacitor is formed by the polysilicon gate and the oxide separating the gate from the semiconductor serves as a dielectric. Large arrays of MOS capacitors (MOSCAPs) can be coupled in parallel to form large transistors. MOS field-effect transistors (MOSFETS) are also placed in large arrays for area efficiency. However, MOS devices (e.g., MOSCAPS and MOSLEM) require access to power supply voltages (e.g., $V_{DD}$ and $V_{SS}$) and the sizes of MOS device arrays are limited by a maximum allowed distance between any MOS device and a bulk connection.

SUMMARY OF THE DISCLOSURE

Aspects disclosed herein include metal-oxide semiconductor (MOS) capacitor (MOSCAP) circuits and MOS device array bulk tie cells for increasing MOS device array density. Methods of fabricating a high density MOSCAP array are also disclosed herein. Capacitance is generated between a MOS gate and a diffusion region of a semiconductor substrate with the source and drain tied together. An amount of capacitance of a MOSCAP depends, in part, on an area of overlap of the diffusion region extending in a first direction and the gate of conductive polysilicon extending in a second direction orthogonal to the diffusion region. Manufacturing rules set a limit on a percentage of the total area of the MOSCAP cell circuit that can be covered by the gate, which therefore limits the capacitance of the MOSCAP cell circuit based on the gate area. Metal routing layers within a cell region allocated for the MOSCAP cell circuit, which are coupled to the MOSCAP cell circuit, also contribute to the total capacitance. In a first exemplary aspect, a gate disposed in a cell region of a MOSCAP cell circuit, wherein the gate comprises a gate width from 10% to 50% of the cell region width, is configured to increase a capacitive density of a MOSCAP cell circuit and a MOSCAP array circuit by increasing an extent to which metal routing layers of the MOSCAP cell circuit contribute to a total MOSCAP capacitance. In an exemplary aspect, an area of a MOSCAP array circuit is reduced because a capacitive density is increased by employing the MOSCAP cell circuits comprising a gate width from 10% to 50% of the cell region width.

Another manufacturing rule limits a maximum distance that a MOS device can be located from a semiconductor bulk connection providing the ground voltage, $V_{SS}$, or supply voltage, $V_{DD}$. Conventional MOS device array circuit sizes are limited in this regard by a maximum distance from a MOS device to bulk ties that provide such connection because such connection is located outside an array perimeter. In an exemplary aspect, bulk tie cells providing bulk ties connecting to the semiconductor bulk are disposed within an array diffusion region in a MOS device array circuit. In this regard, larger MOS device array sizes are possible, which further increases MOS device array circuit density. The array diffusion regions include a first device region including MOS devices and a bulk tie cell including the bulk ties. The bulk tie cell is isolated from the first device region by a diffusion cut. A diffusion cut is formed between a first gate on the device region and a second gate on the bulk tie cell. In an example, a non-conductive oxide is formed in the diffusion cut to electrically isolate the first device region comprising the MOS devices from the bulk tie cell comprising the bulk ties.

In an exemplary aspect, a MOSCAP cell circuit is disclosed. The MOSCAP cell circuit includes a semiconductor substrate and a cell region of the semiconductor substrate. The cell region comprises a region width in a first axis direction from a first region side to a second region side and a region length extending in a second axis direction, orthogonal to the first axis direction, from a first region end to a second region end. The MOSCAP cell circuit includes a diffusion region comprising an impurity disposed in the semiconductor substrate, the diffusion extending from the first region side to the second region side of the cell region. The MOSCAP cell circuit includes a gate disposed within the cell region on the semiconductor substrate, the gate comprising a gate width extending in the first axis direction from a first gate side to a second gate side and a gate length extending in the second axis direction from a first gate end to a second gate end, wherein the gate width is from 10% to 50% of the region width.

In another exemplary aspect, a MOSCAP array circuit is disclosed. The MOSCAP array circuit comprises a semiconductor substrate and a plurality of MOSCAP cell circuits. Each of the MOSCAP cell circuits comprises a cell region of the semiconductor substrate, the cell region comprising a region width extending in a first axis direction from a first region side to a second region side and a region length extending in a second axis direction, orthogonal to the first axis direction, from a first region end to a second region end. Each of the MOSCAP cell circuits comprises a diffusion region comprising an impurity disposed in the semiconductor substrate, the diffusion region comprising a portion of the cell region extending from the first region side to the second region side. Each of the MOSCAP cell circuits comprises a gate disposed on the semiconductor substrate and within the cell region, the gate comprising a gate width extending in the first axis direction from a first gate side to a second gate side and a gate length extending in the second axis direction from a first gate end to a second gate end, wherein the gate width is from 10% to 50% of the region width.

In another exemplary aspect, MOS device array is disclosed. The MOS device array circuit comprises a semiconductor substrate comprising a surface and a bulk region and an array diffusion region. The array diffusion region comprises a first type of dopant in the surface of the semiconductor substrate, the array diffusion region extending along a longitudinal axis in a first axis direction and comprising a first device region and a bulk tie cell. The MOS device array circuit comprises at least one MOS device in the first device region and at least one bulk tie disposed in the bulk tie cell and connected to the bulk region of the semiconductor substrate. The MOS device array comprises a plurality of gates disposed on the semiconductor substrate and extending in a second axis direction, orthogonal to the first axis direction, above the array diffusion region and separated from each other in the first axis direction according to a gate pitch. The MOS device array circuit comprises a first diffusion cut disposed in the surface of the semiconductor substrate on a first side of the bulk tie cell between a first gate on the first device region and a second gate on the bulk tie cell, the diffusion cut electrically isolating the bulk tie cell from the first device region.

BRIEF DESCRIPTION OF THE FIGURES

FIG. 6 is an illustration of a top view of diffusion regions in a conventional MOS device array circuit;

FIG. 7 is an illustration of a top view of diffusion regions included in a MOS device array including exemplary bulk tie cells disposed within diffusion regions and at diffusion region ends for increased MOS device array size and overall MOS device density;

DETAILED DESCRIPTION

Figure 1:
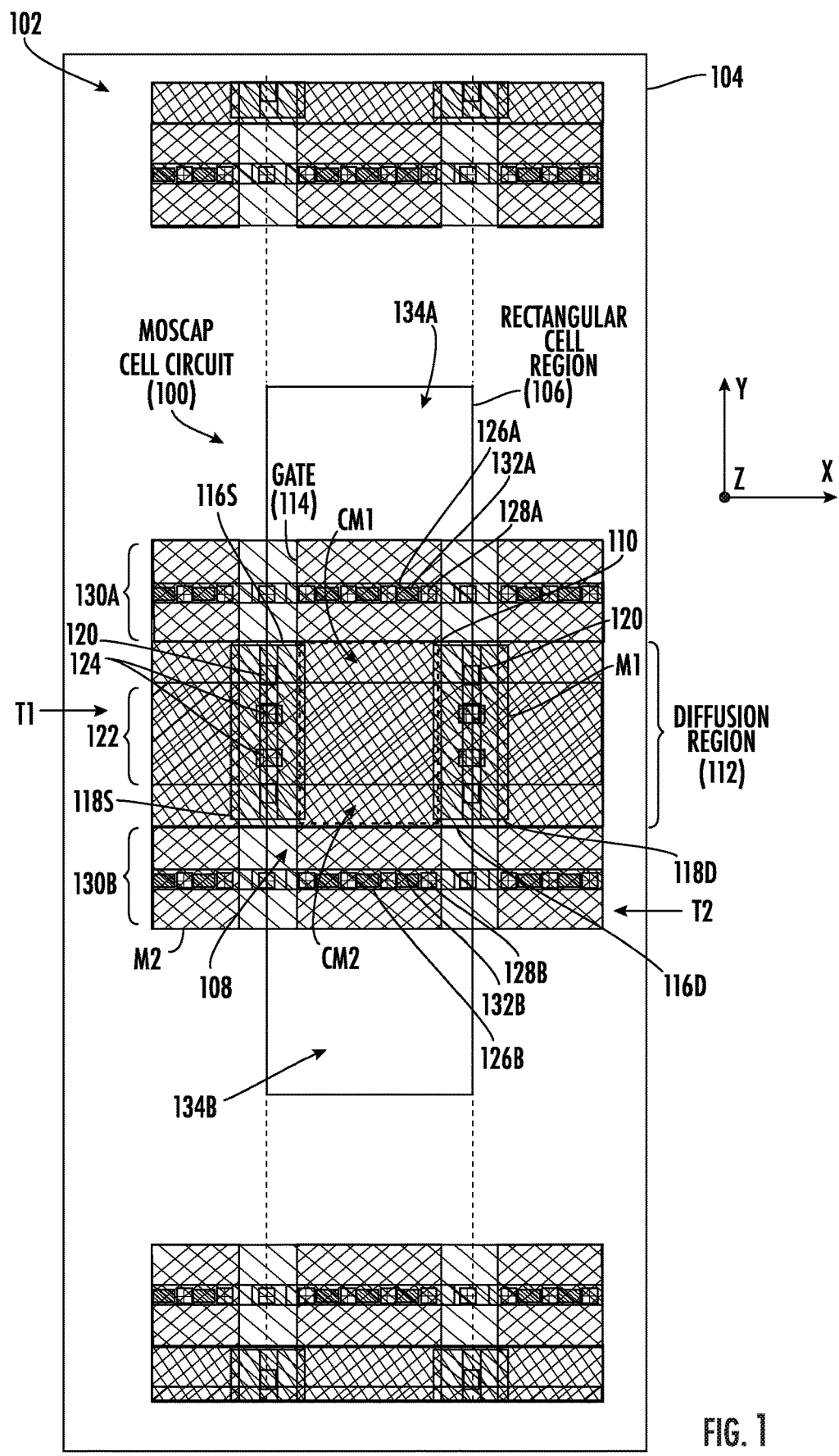
FIG. 1 is an illustration of a top view of a conventional metal-oxide semiconductor (MOS) capacitor (MOSCAP) cell circuit in a MOSCAP array circuit on a semiconductor substrate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include metal-oxide semiconductor (MOS) capacitor (MOSCAP) circuits and MOS device array bulk tie cells for increasing MOS device array density. Methods of fabricating a high density MOSCAP array are also disclosed herein. Capacitance is generated between a MOS gate and a diffusion region of a semiconductor substrate with the source and drain tied together. An amount of capacitance of a MOSCAP depends, in part, on an area of overlap of the diffusion region extending in a first direction and the gate of conductive polysilicon extending in a second direction orthogonal to the diffusion region. Manufacturing rules set a limit on a percentage of the total area of the MOSCAP cell circuit that can be covered by the gate, which therefore limits the capacitance of the MOSCAP cell circuit based on the gate area. Metal routing layers within a cell region allocated for the MOSCAP cell circuit, which are coupled to the MOSCAP cell circuit, also contribute to the total capacitance. In a first exemplary aspect, a gate disposed in a cell region of a MOSCAP cell circuit, wherein the gate comprises a gate width from 10% to 50% of the cell region width, is configured to increase a capacitive density of a MOSCAP cell circuit and a MOSCAP array circuit by increasing an extent to which metal routing layers of the MOSCAP cell circuit contribute to a total MOSCAP capacitance. In an exemplary aspect, an area of a MOSCAP array circuit is reduced because a capacitive density is increased by employing the MOSCAP cell circuits comprising a gate width from 10% to 50% of the cell region width.

Another manufacturing rule limits a maximum distance that a MOS device can be located from a semiconductor bulk connection providing the ground voltage, $V_{SS}$, or supply voltage, $V_{DD}$. Conventional MOS device array circuit sizes are limited in this regard by a maximum distance from a MOS device to bulk ties that provide such connection because such connection is located outside an array perimeter. In an exemplary aspect, bulk tie cells providing bulk ties connecting to the semiconductor bulk are disposed within an array diffusion region in a MOS device array circuit. In this regard, larger MOS device array sizes are possible, which further increases MOS device array circuit density. The array diffusion regions include a first device region including MOS devices and a bulk tie cell including the bulk ties. The bulk tie cell is isolated from the first device region by a diffusion cut. A diffusion cut is formed between a first gate on the device region and a second gate on the bulk tie cell. In an example, a non-conductive oxide is formed in the diffusion cut to electrically isolate the first device region comprising the MOS devices from the bulk tie cell comprising the bulk ties.

FIG. 1 is an illustration of a top view of a conventional MOSCAP cell circuit 100 in a MOSCAP array circuit 102 on a semiconductor substrate 104. The MOSCAP cell circuit 100 is disposed and arranged within a rectangular cell region 106 that is repeated side-by-side in the X-axis direction and the Y-axis direction to form the MOSCAP array circuit 102. The MOSCAP cell circuits 100 each have a capacitance 108 and a plurality of the MOSCAP cell circuits 100 can be coupled together in parallel for a larger capacitance. Thus, an area of the MOSCAP array circuit 102 is defined by the area of the rectangular cell region 106 times the number of MOSCAP cell circuits 100 needed to achieve a total desired capacitance of the MOSCAP array circuit 102.

The capacitance 108 is provided by an area 110 in which a diffusion region 112 of the semiconductor substrate 104 is overlapped by a polysilicon gate ("gate") 114. The diffusion region 112 extends across the rectangular cell region 106 in the X-axis direction and the gate 114 extends within the rectangular cell region in the Y-axis direction. In this regard, the MOSCAP cell circuit 100 is structurally similar to the features of a MOS transistor (not shown). Thus, the diffusion region 112 on a first side of the gate 114 is referred to herein as a source 116S and the diffusion region 112 on a second side of the gate 114 is referred to herein as a drain 116D.

Source conductor 118S and drain conductor 118D are metal conductors disposed in a first metal layer M1 above the diffusion region 112 and are coupled to the source 116S and the drain 116D, respectively, by vias 120. The source and drain conductors 118S and 118D are both further coupled to a terminal conductor 122 in a second metal layer M2 by vias 124 to electrically connect the source 116S and the drain 116D to each other. In this regard, the terminal conductor 122 coupled to the diffusion region 112 is a first terminal T1 of the MOSCAP cell circuit 100.

Gate pads 126A and 126B are disposed in the first metal layer M1. The gate pads 126A and 126B are coupled down to the gate 114 by vias 128A and 128B and are coupled upward to gate conductors 130A and 130B by vias 132A and 132B, respectively. Since the gate conductors 130A and 130B are both coupled to the gate 114, a second terminal T2 of the MOSCAP cell circuit 100 is provided by the gate conductors 130A and 130B.

A secondary source of capacitance in the MOSCAP cell circuit 100, in addition to the capacitance 108 provided by the area 110 in which the gate 114 overlaps the diffusion region 112, is derived from the terminal conductor 122, and the gate conductors 130A and 130B. For example, edge to edge capacitances CM1 and CM2 are created between the terminal conductor 122, which forms the first terminal T1, and the gate conductors 130A and 130B, which form the second terminal T2. Although the source and drain conductors 118S and 118D are overlapped by the terminal conductor 122, the source and drain conductors 118S and 118D are electrically coupled to the terminal conductor 122. Thus, no plate to plate capacitance is created by the source and drain conductors 118S and 118D. Similarly, there is no capacitance provided by the gate pads 126A and 126B and the corresponding gate conductors 130A and 130B because they are electrically connected by vias 132A and 132B. Thus, the most significant sources of the capacitance 108 are the area 110 of the gate 114 overlapping the diffusion region 112 and the edge to edge capacitances CM1 and CM2.

The rectangular cell region 106 includes empty spaces 134A and 134B to space apart the respective gates 114 so the MOSCAP cell circuit 100 will conform with a manufacturing requirement regarding a maximum polysilicon density. The empty spaces 134A and 134B are needed because the shape of the gate 114 does not promote an efficient use of area. The empty spaces 134A and 134B reduce the capacitive density of the MOSCAP array circuit 102 which increases a size of the MOSCAP array circuit 102.

Figure 2:
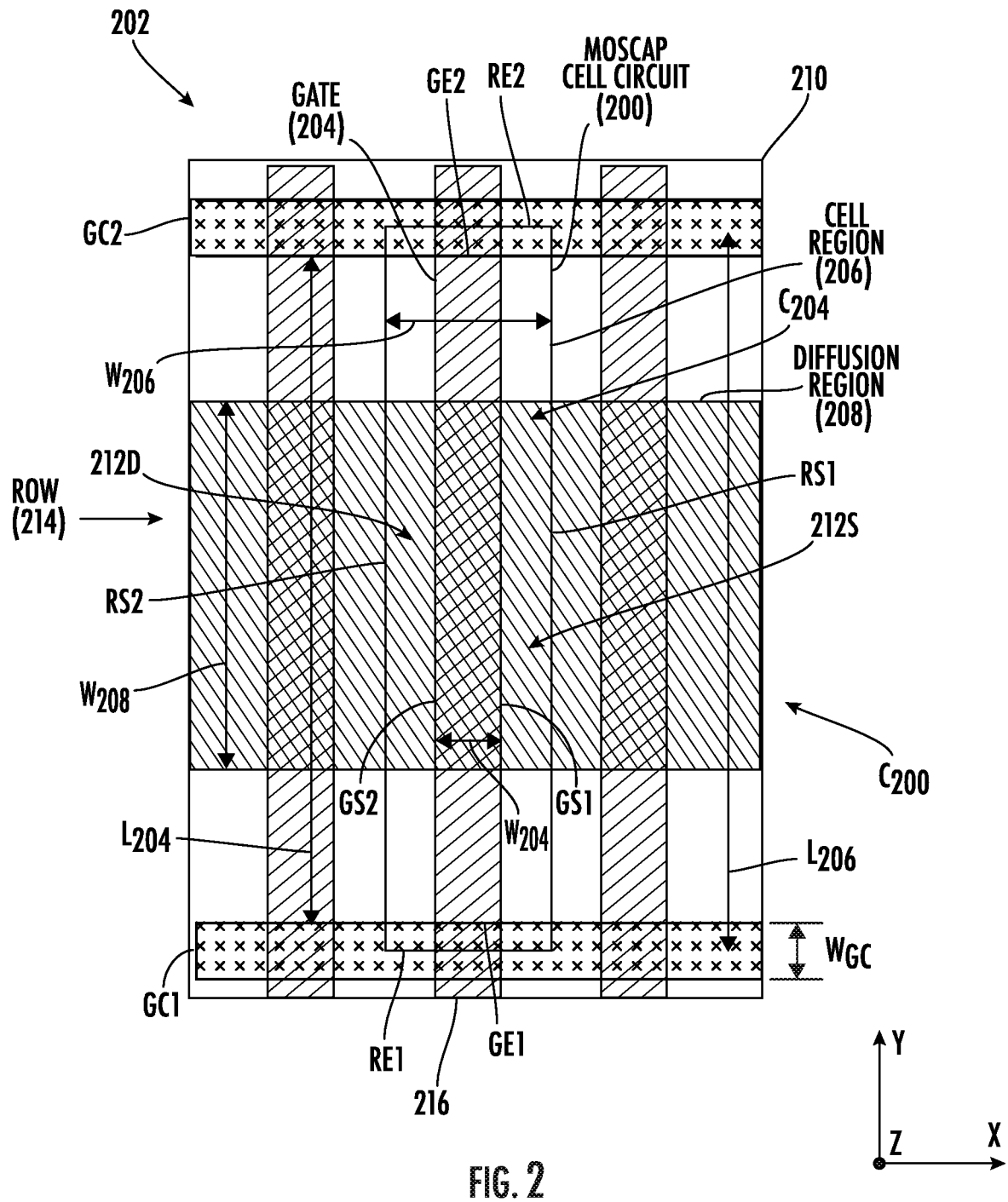
FIG. 2 is an illustration of a top view of an exemplary MOSCAP cell circuit including a gate disposed in a cell region configured to increase the extent to which metal routing layers of the MOSCAP cell circuit contribute to a total capacitance to increase capacitor density in an array of MOSCAPs and reduce an area of a MOSCAP array circuit in an integrated circuit (IC)

FIG. 2 is an illustration of a top view of an exemplary MOSCAP cell circuit 200 in a MOSCAP array circuit 202. The MOSCAP cell circuit 200 has a total capacitance $C_{200}$. A MOSCAP array circuit 202 includes a plurality of the MOSCAP cell circuits 200 coupled together in parallel for a larger capacitance. The view of the MOSCAP cell circuit 200 in FIG. 2 includes a gate 204 disposed in a cell region 206. The cell region 206 defines a boundary allocated for the MOSCAP cell circuit 200. The MOSCAP cell circuit 200 also includes a diffusion region 208 that is overlapped by the gate 204 to create a plate to plate type capacitance $C_{204}$. The MOSCAP cell circuit 200 is formed in a doped semiconductor substrate 210, such as silicon, and the gate 204 is formed of conductive polysilicon. As discussed further below with regard to FIG. 3, the gate 204 and cell region 206 dimensions are configured to increase the extent to which metal routing layers contribute to the total capacitance $C_{200}$ of the MOSCAP cell circuit 200 to increase capacitor density and reduce area of a MOSCAP array circuit 202.

The cell region 206 of the semiconductor substrate 210 includes features and geometries that are repeated within other instances of the cell region 206 disposed in the X-axis direction and/or the Y-axis direction to form the MOSCAP array circuit 202. These features are described with reference to FIG. 2. An area of the semiconductor substrate 210 allocated to the cell region 206 is defined by a cell region width $W_{206}$ in the X-axis direction and a cell region length $L_{206}$ in the Y-axis direction. The cell region 206 includes a first region side RS1 opposite to a second region side RS2 in the X-axis direction, and a first region end RE1 and a second region end RE2 opposite each other in the Y-axis direction.

The diffusion region 208 is doped with a trivalent or pentavalent impurity to form a P-type or N-type diffusion region. The diffusion region 208 extends through a plurality of cell regions 206 in the MOSCAP array circuit 202 in the X-axis direction. Within the cell region 206, the diffusion region 208 extends from the first region side RS1 to the second region side RS2 of the cell region 206. The diffusion region 208 has a width $W_{208}$ in the Y-axis direction that is 40% to 80% of the cell region length $L_{206}$. In an example, the diffusion region width $W_{208}$ is 50% of the cell region length $L_{206}$. The diffusion region 208 width $W_{208}$ may be centered on the cell region length $L_{206}$ in the Y-axis direction.

The gate 204 is disposed on the semiconductor substrate 210 with a gate width $W_{204}$ extending in the X-axis direction from a first gate side GS1 to a second gate side GS2. In an example, the gate width $W_{204}$ is 40 nanometers (nm), the cell region length $L_{206}$ is 430 nm, and the cell region width $W_{206}$ is 100 nm. The gate width $W_{204}$ is 10% to 50% of the cell region width $W_{206}$. In some examples, the gate width $W_{204}$ is 12% to 43% of the cell region width $W_{206}$. In some examples, the gate width $W_{204}$ is 35% to 40% of the cell region width $W_{206}$.

As noted, the diffusion region 208 extends from the first region side RS1 to the second region side RS2 of the cell region 206, but the gate width $W_{204}$ is from 10% to 50% of the cell region width $W_{206}$. Thus, the diffusion region 208 is wider in the X-axis direction than the gate 204. A source portion 212S of the diffusion region 208 is disposed between the first gate side GS1 of the gate 204 and the first region side RS1 of the cell region 206. A drain portion 212D is disposed between the second gate side GS2 of the gate 204 and the second region side RS2 of the cell region 206. The source portion 212S and the drain portion 212D correspond to source and drain portions of MOS transistors formed in similar structures but are electrically coupled to each other so the diffusion region 208 will behave as a single conductive plate of a capacitor.

The gate 204 has a length $L_{204}$ in the Y-axis direction extending from a first gate end GE1 to a second gate end GE2. To fabricate a two-dimensional MOSCAP array circuit 202, a gate 204 is formed as part of a longer polysilicon gate extending in the Y-axis direction and portions thereof become the gate 204 in a plurality of cell regions 206 in column (not shown) with each being in a different row 214. The gates 204 of respective MOSCAP cell circuits 200 in a same column (i.e., including the same gate 204) are electrically separated from each other because sections of the gates 204 are removed by gate cuts GC1 and GC2. As shown in FIG. 2, the first gate end GE1 of the gate 204 and a gate 216 (shown in part) in another cell region 206 that abuts the first region end RE1 are separated from each other by the first gate cut GC1 extending in the X-axis direction in the semiconductor substrate 210. The gate cut GC1 removes a portion of the gate 204. Thus, the first gate end GE1 is separated from the first region end RE1 of the cell region 206 by the gate cut GC1. Additionally, the second gate end GE2 of the gate 204 is separated from the second region end RE2 of the cell region 206 by a second gate cut GC2. The gate cuts GC1 and GC2 have a width $W_{GC}$. The gate 204 extends in the Y-axis direction from the first gate cut GC1 to the second gate cut GC2. In some examples, the width $W_{GC}$ is less than the gate width $W_{204}$. In some examples, the width $W_{GC}$ of the first gate cut GC1 and the second gate cut GC2 is 30 nm to 40 nm. In some examples, the cell region length $L_{206}$ is in a range from eight (8) times the gate width $W_{204}$ to twelve (12) times the gate width $W_{204}$.

Figure 3:
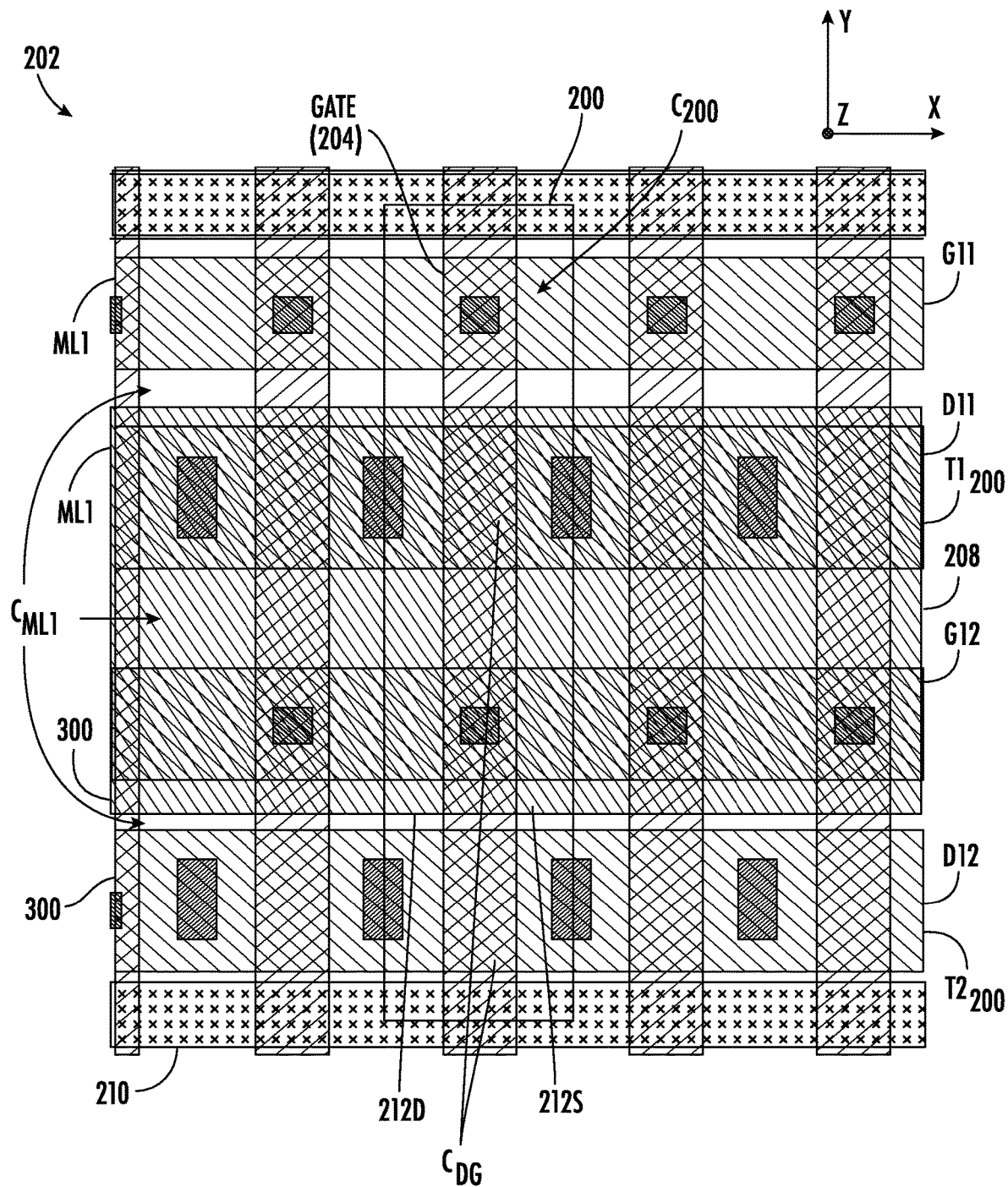
FIG. 3 is an illustration of another top view of the exemplary MOSCAP cell circuit in FIG. 2, showing metal conductors in a first metal layer with opposing voltage polarities providing edge to edge capacitance to increase a total capacitance of the MOSCAP cell circuit.

FIG. 3 is an illustration of another top view of the exemplary MOSCAP cell circuit 200 in FIG. 2 in the MOSCAP array circuit 202. FIG. 3 is provided to show metal conductors G11, D11, D12, and G12, referred to collectively as "first metal conductors 300", disposed in a first metal layer ML1. As shown, the metal conductor D11 is disposed between the metal conductor G12 and the metal conductor G11. The metal conductor G12 is disposed between the metal conductor D11 and the metal conductor D12. The first metal conductors 300 are disposed directly above (i.e., in the Z-axis direction) the gate 204. The first metal layer ML1 as disclosed herein is a first (i.e., lowest) layer of metal disposed above the gate 204, with no other layers of metal between the first metal layer ML1 and the gate 204. The first metal layer ML1 may be disposed on the semiconductor substrate 210 in a back-end-of-line (BEOL) process or a middle-of-line (MOL) process but is not limited in this regard.

The metal conductors D11 and D12 are disposed in the first metal layer ML1 extending in the X-axis direction and are both coupled to the source portion 212S of the diffusion region 208 on a first side of the gate 204 and to the drain portion 212D of the diffusion region 208 on a second side of the gate 204. In this regard, one or both of the metal conductors D11 and D12 form a first terminal $T1_{200}$ of the MOSCAP cell circuit 200. The metal conductors G11 and G12 are also disposed in the first metal layer ML1 and extend in the X-axis direction and are each coupled to the gate 204. One or both of the metal conductors G11 and G12 form a second terminal $T2_{200}$ of the MOSCAP cell circuit 200.

The MOSCAP 200 provides capacitance $C_{204}$ rather than operating as a transistor because source portion 212S and the drain portion 212D of the diffusion region 208 are coupled to each other and have a same voltage potential opposite to a voltage potential of the gate 204. A charge is stored by the capacitance $C_{200}$ when opposite voltage polarities are supplied to the first terminal $T1_{200}$ and the second terminal $T2_{200}$.

In view of the relative positions of the first metal conductors 300, the MOSCAP cell circuit 200 also generates edge to edge capacitance $C_{ML1}$ between the metal conductors G11 and D11, D11 and G12, and G12 and D12. The MOSCAP cell circuit 200 also generates a plate to plate capacitance $C_{DG}$ where the metal conductors D11 and D12 overlap the gate 204. The MOSCAP cell circuit 100 does not include a capacitance corresponding to the capacitance $C_{ML1}$. The capacitance $C_{ML1}$ is a first example that the configuration of the gate 204 and the cell region 206 increase the extent to which the MOSCAP cell circuit 200 can provide increased capacitance.

Furthermore, FIG. 3 shows that the MOSCAP cell circuit 200 includes a number of metal conductors (D11 and D12) in the metal layer ML1 that are coupled to the diffusion region and the same number of metal conductors (G11 and G12) in the metal layer ML1 that are coupled to the gate. Because there are an even number of metal conductors and the metal conductors coupled to the diffusion region are disposed in alternating order with the metal conductors coupled to the ground in the Y-axis direction, there is a metal conductor coupled to the diffusion region at one end (e.g., region end RE1) and a metal conductor coupled to the gate at the other end (e.g., region end RE2). Thus, adjacent MOSCAP cell circuits 200 abutting in the Y-axis direction develop an edge to edge capacitance from one MOSCAP cell circuit 200 to another at the region ends RE1 and RE2. In this regard, the MOSCAP cell circuit 200 may include any even number of metal conductors extending in the first axis direction and coupled alternatively to the diffusion region 208 and the gate 204. to provide additional edge to edge capacitance in a column of a MOSCAP array circuit 202.

Figure 4:
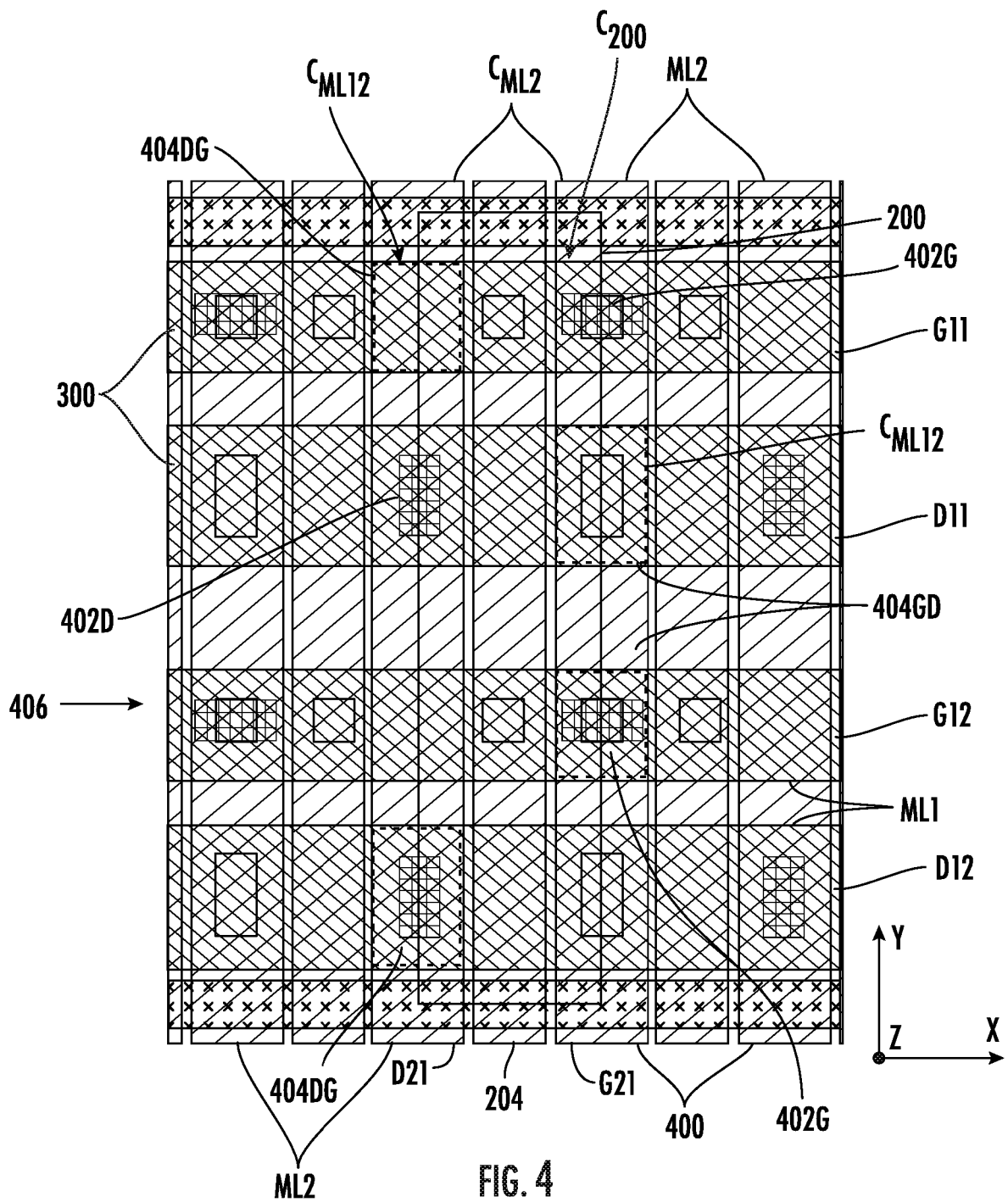
FIG. 4 is an illustration of another top view of the exemplary MOSCAP cell circuit in FIG. 2, showing metal conductors in a second metal layer providing edge to edge capacitance and overlapping the first metal layer conductors to increase a total capacitance of the MOSCAP cell circuit.

FIG. 4 is an illustration of another top view of the MOSCAP cell circuit 200 in FIG. 2 including the first metal conductors 300 of FIG. 3 and second metal conductors 400 disposed in a second metal layer ML2. The second metal layer ML2 is a next layer above the first metal layer ML1 with no intervening metal layers. In other words, the second metal layer ML2 is the second lowest layer of metal above the gate 204.

The second metal conductors 400 include a metal conductor G21 and a metal conductor D21 both extending in the Y-axis direction. The metal conductor G21 is coupled to the gate 204 by first coupling to at least one of the metal conductors G11 and G12 through vias 402G. The metal conductor D21 is coupled to the diffusion region 208 (see FIG. 3) by first coupling to at least one of the metal conductors D11 and D12 through vias 402D. Thus, the metal conductors G21 and D21 have opposing voltage polarities providing edge to edge capacitance $C_{ML2}$ to increase a total capacitance of the MOSCAP cell circuit 200. Additional capacitance $C_{ML12}$ is created between the first metal layer ML1 and the second metal layer ML2 at overlapping area 404GD at which the metal conductor D21 overlaps the conductors G11 and G12. The metal conductor D21 is coupled to the diffusion region 208 and the conductors G11 and G12 are coupled to the gate 204. The capacitance $C_{ML12}$ is also created at areas 404DG at which the metal conductor G21, coupled to the gate 204, overlaps the conductors D11 and D12 coupled to the diffusion region 208. The overlapping areas 404GD and 404DG provide plate to plate capacitance based on an area of overlap between the first metal layer ML1 and the second metal layer ML2. The MOSCAP cell circuit 100 in FIG. 1 does not include the capacitance $C_{ML12}$ because there are no overlapping regions corresponding to the overlapping areas 404GD and 404DG. Thus, the MOSCAP cell circuit 200 provides more sources of capacitance within the cell region 206 than are provided within the rectangular cell region 106. These additional sources of capacitance raise the total capacitance $C_{200}$.

With reference to FIGS. 2-4, the MOSCAP cell circuit 200 has a total capacitance $C_{200}$ that is based on a combination of at least the capacitance $C_{204}$ where the gate 204 overlaps the diffusion region 208, the capacitance $C_{ML1}$ between edges of adjacent metal conductors 300 having opposite voltage polarities, and the capacitance $C_{ML12}$ where metal conductors 400 overlap metal conductors 300 having opposite voltage polarities. In this regard, greater capacitance within an area corresponds to increased capacitive density.

A MOSCAP array circuit 202 includes a plurality of MOSCAP cell circuits 200 disposed on the semiconductor substrate 210. In an example, the MOSCAP array circuit 202 may be two-dimensional, including a first plurality of MOSCAP cell circuits 200 with respective cell regions 206 abutted side by side in a row 406 in the X-axis direction and a second plurality of MOSCAP cell circuits 200 with cell regions 206 abutted end to end in a column (not shown) in the Y-axis direction. A MOSCAP array circuit 202 including the MOSCAP cell circuits 200 with greater capacitive density can be smaller in area than the MOSCAP array circuit 102 in FIG. 1 for providing the same particular capacitance.

Figure 5:
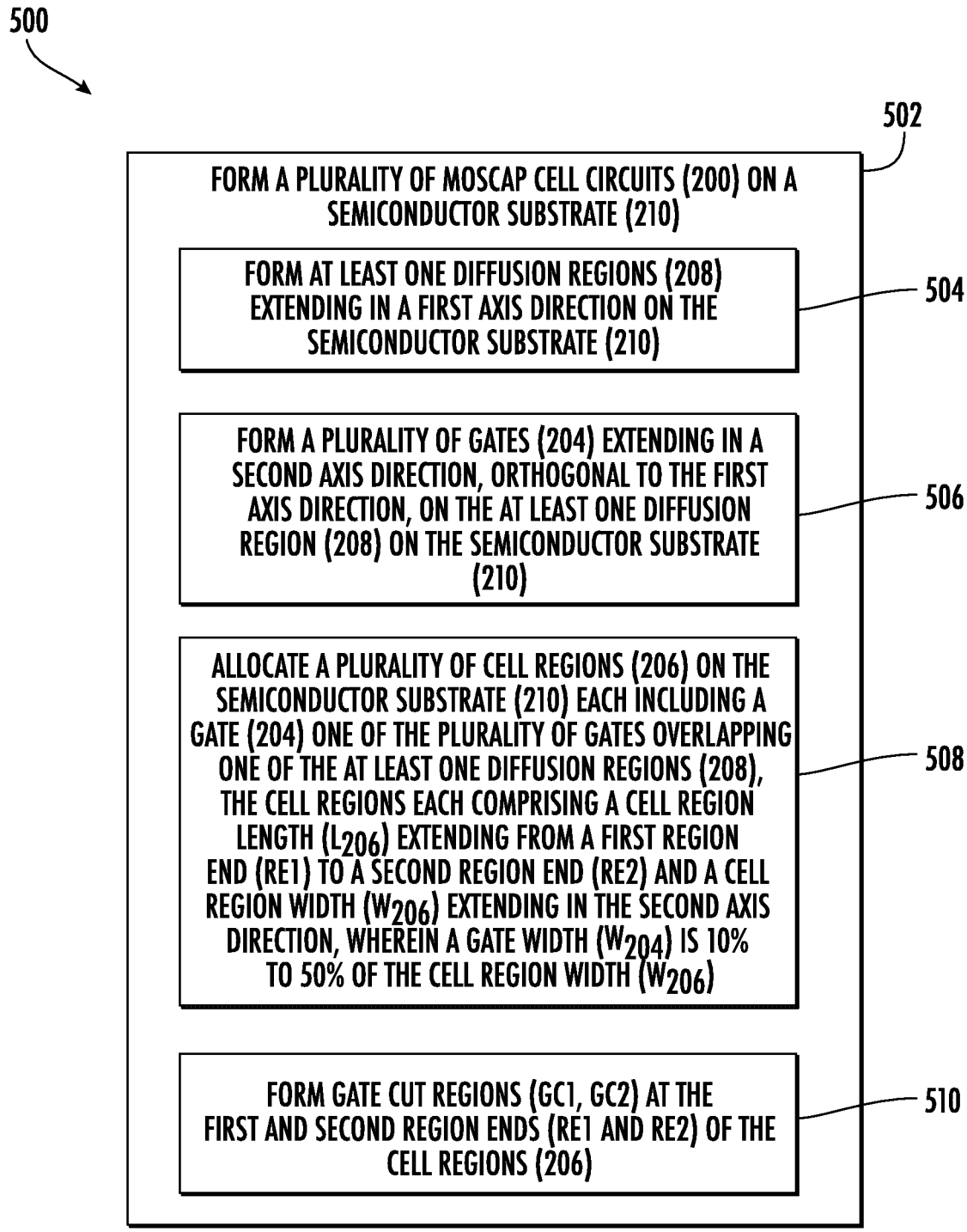
FIG. 5 is flowchart of an exemplary method for fabricating the MOSCAP cell circuit and MOSCAP array circuit in FIG. 2.

FIG. 5 is a flowchart of a method 500 of fabricating a MOSCAP array circuit 202. The method comprises forming a plurality of MOSCAP cell circuits 200 on a semiconductor substrate 210 (block 502). The method 500 further includes forming at least one diffusion region 208 extending in a first axis direction on the semiconductor substrate 210 (block 504). The method 500 includes forming a plurality of gates 206 extending in a second axis direction, orthogonal to the first axis direction, on the at least one diffusion region 208 on the semiconductor substrate 210, the gates 206 comprising a width $W_{206}$ (block 506). The method 500 includes allocating a plurality of cell regions 206 on the semiconductor substrate 210 each including one of the plurality of gates 204 overlapping one of the at least one diffusion regions 208, the cell regions each comprising a cell region length $L_{206}$ extending from a first region end RE1 to a second region end RE2 and a cell region width $W_{206}$ extending in the second axis direction, wherein a gate width $W_{204}$ is 10% to 50% of the cell region width $W_{206}$ (block 508). The method 500 further includes forming gate cut regions GC1, GC2 at the first and second region ends RE1 and RE2 of the cell regions 206 (block 510).

FIG. 6 is an illustration of a top view of diffusion regions 600 disposed in a semiconductor substrate 602 during fabrication of a MOS device array 604. MOS devices (not shown) such as MOS transistors or MOSCAP cell circuits are formed in the diffusion regions 600. MOS devices are typically powered by a supply voltage $V_{DD}$ and a ground voltage $V_{SS}$. The bulk region of a semiconductor substrate 602, which can be accessed by a bulk tie 605, provides either the supply voltage $V_{DD}$ or the ground voltage $V_{SS}$ common to all the MOS devices in the MOS device array 604. Whether a semiconductor bulk region provides the ground voltage $V_{SS}$ or the supply voltage $V_{DD}$ depends on whether the semiconductor bulk region is N-type or P-type. A length $L_{600}$ of the diffusion regions 600 is based on a manufacturing requirement that MOS devices must be within a range of, for example, 30 microns from a bulk tie, which is conventionally placed outside a MOS device array 604. In this example, subject to bulk ties 605 being located only at one end 606 of the diffusion regions 600, the length $L_{600}$ is less than 60 microns. Thus, a MOS device located at a midpoint $M_{600}$ would not be more than 30 microns from a bulk tie 605 outside of the MOS device array 604 at one of the ends 606.

As an alternative to bulk ties 605 placed only at an end 606 of a diffusion region (i.e., in the X-axis direction), as in FIG. 6, a bulk tie may be located above or below (i.e., in the Y-axis direction) the MOSCAP array circuit 604 in FIG. 6. Thus, the MOSCAP array circuit 604 is limited to a maximum size of 60 microns by 60 microns and adjacent MOSCAP array circuits 604 must be separated by sufficient space to include a suitable number of bulk ties for the respective MOSCAP array circuits 604. Such restrictions regarding MOS array circuit sizes defines a maximum possible density for MOS device arrays.

FIG. 7 is an illustration of a top view of diffusion regions 700 included in a MOS device array 702 employing exemplary bulk tie cells 704 disposed both within the diffusion regions 700 and at diffusion region ends 706 for increased MOS device density and a smaller MOS device array 702. The bulk tie cells 704 provide connections to bulk 708 below the surface of a semiconductor substrate 710. In FIG. 7, the diffusion regions 700 extend in the X-axis direction. Bulk tie cells 704 are located at a mid-point location 712 in the X-axis direction and at ends 706. MOS devices in the diffusion regions 700 are subject to the same maximum distance limitation noted above with regard to FIG. 6. However, because the bulk tie cells 704 are located within the diffusion regions 700, and not outside the MOS device array 702, longer diffusion regions 700 are possible. For example, a length $L_{700}$ from one of the ends 706 to the other end 706 may be up to 120 microns with a bulk tie cell 704 at each end 706 and at the mid-point 712. In such configuration, any MOS devices formed in the diffusion regions 700 are less than 30 microns from a bulk tie cell 704.

Further, the diffusion regions 700 are not limited to the configuration shown. The bulk tie cells 704 may be placed closer together than 60 microns and more bulk tie cells 704 may be included within the diffusion regions 700, as desired. The bulk tie cells 704 in adjacent diffusion regions 700 may be in different locations along the X-axis. IN addition, the diffusion regions 700 may be extended indefinitely up to a maximum diffusion region length based on unrelated considerations, as long as bulk tie cells 704 are provided (e.g., periodically) in the diffusion regions 700, at separations of less than twice the maximum allowed distance (e.g., less than 60 microns in the example) so that no MOS device is greater than the maximum allowed distance from a bulk tie cell 704. In this manner, the MOS device array 702 can be made larger. In another regard, MOS device arrays 702 can be located closer together because bulk tie cells 704 are disposed within the MOS device arrays 702 and not around the exterior. Based on the above differences from the diffusion regions 600 in FIG. 6, MOS device array density can be improved. Details of the diffusion regions 700 including bulk tie cells 704 are discussed further in FIGS. 8-11.

Figure 8:
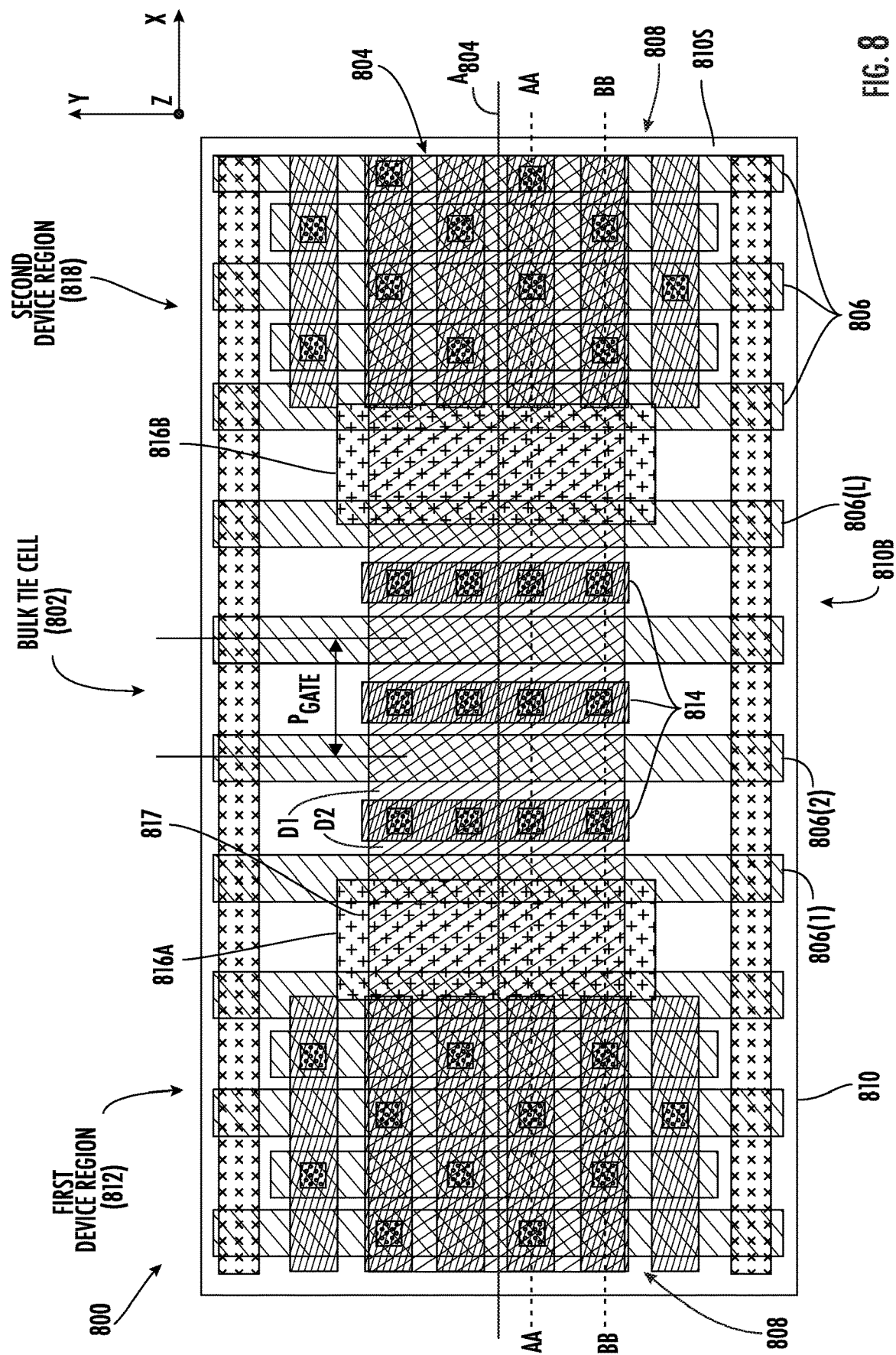
FIG. 8 is a detailed illustration of a top view of an exemplary bulk tie cell within a diffusion region in a MOS device array for increasing capacitor density and reducing area of a MOS device array.

In another aspect of the present disclosure, FIG. 8 is a detailed illustration of a top view of an exemplary MOS device array circuit 800 including a bulk tie cell 802 within an array diffusion region 804. FIG. 8 corresponds to a view of one of the bulk tie cells 704 at mid-point 712 in the diffusion regions 700 in FIG. 7. Thus, the diffusion region 804 extends both ways in the X-axis direction, though not shown here. FIG. 8 shows gates 806 of MOSCAP cell circuits 808 at a first side of the bulk tie cell 802 in the MOS device array circuit 800. FIG. 8 also shows gates 806 of MOS devices 808 at a second side of the bulk tie cell 802. The MOS devices 808 may be MOS transistors (e.g., MOS field effect transistors (MOSFETS)) or the MOSCAP cell circuits 200 shown in FIGS. 2-4. It should be understood that the array diffusion region 804 is only a segment of an entire array diffusion region 804 extending one or both ways in the X-axis direction and is not limited to the MOS devices 808 shown in FIG. 8.

The MOS device array circuit 804 ("MOS array 800") includes a semiconductor substrate 810 including a surface 810S and a bulk region 810B below the surface 810S in the Z-axis direction. The MOS array 800 includes the array diffusion region 804 including a first type of dopant D1 to a diffusion thickness $T_{804}$ (see FIG. 10) in the surface 810S of the semiconductor substrate 810. The array diffusion region 804 extends along a longitudinal axis $A_{804}$ in the X-axis direction. The array diffusion region 804 includes a first device region 812, in which MOS devices 808 are formed, and the bulk tie cell 802 including bulk ties 814 that connect to the bulk region 810B. The bulk ties 814 also couple to at least one of the MOS devices 808 to provide the ground voltage $V_{SS}$ (or the supply voltage $V_{DD}$). Thus, at least one MOS device 808 is disposed in the first device region 812 and at least one bulk tie 814 connected to the bulk region 810B is disposed in the bulk tie cell 802.

The MOS array 800 also includes the gates 806 disposed on the surface 810S of the semiconductor substrate 810. The gates 806 extend in the Y-axis direction above the array diffusion region 804, orthogonal to the array diffusion region 804. The gates 806 are consistently separated from each other in the X-axis direction over the first device region 812 and the bulk tie cell 802 according to a gate pitch $P_{GATE}$. In an example, the gate pitch $P_{GATE}$ is 100 nm. The MOS array 800 also includes a first diffusion cut 816A disposed or formed in the surface 810S of the semiconductor substrate 810. The first diffusion cut 816A is formed by removing (e.g., etching out) the doped surface 810S in the array diffusion region 804 and filling the first diffusion cut with an oxide layer 817, for example. The first diffusion cut 816A is disposed on a first side of the bulk tie cell 802 between a first gate 806 on the first device region 812 and a second gate 806 on the bulk tie cell 802. Thus, the bulk tie cell 802 is part of the array diffusion region 804 that is electrically isolated from the first device region 812 by the first diffusion cut 816A. In FIG. 8, the array diffusion region 804 further includes a second diffusion cut 816B on a second side of the bulk tie cell 802 between a last gate 806(L) of the gates 806 on the bulk tie cell 802 in the X-axis direction and a next gate 806 in the X-axis direction.

The array diffusion region 804 further includes a second device region 818 disposed along the longitudinal axis $A_{804}$. The second device region 818 includes at least one MOS device 808 and is electrically isolated from the bulk tie cell 804 by the second diffusion cut 816B. The next gate 806 on one side of the second diffusion cut 816B is disposed on the second device region 818.

Formed from part of the array diffusion region 804, the bulk tie cell 802 between the first diffusion cut 816A and the second diffusion cut 816B includes the first type dopant D1 disposed to the diffusion thickness $T_{804}$. The bulk tie cell 802 includes one or more of the bulk ties 814, which include a second type of dopant (i.e., P-type or N-type) D2 opposite to the first type of dopant D1. The dopant D1 extends through the diffusion thickness $T_{804}$ of the array diffusion region 804 and is coupled to the bulk region 810B.

Each of the one or more bulk ties 814 is formed between two gates 806 on the bulk tie cell 802. In some examples, the bulk tie cell 802 may include only one bulk tie 814 formed between a first gate 806(1) in the first axis direction on the bulk tie cell 802 and a second gate 806(2) on the bulk tie cell 802. In such examples, the second gate 806(2) would be the last gate 806(L) in the X-axis direction on the bulk tie cell 802 before the second diffusion cut 816B. In the example in FIG. 8, the bulk tie cell 802 includes three (3) bulk ties 814 with the first bulk tie 814 disposed between the first gate 806(1) and the second gate 806(2) and the additional bulk ties 814 consecutively disposed between consecutive gates 806 on the bulk tie cell 802 from the second gate 806(2) to the last gate 806(L) in the first axis direction on the bulk tie cell 802. Cross-sectional side views of the array diffusion region 804 at cut lines AA and BB are shown in FIGS. 10 and 11.

Figure 9:
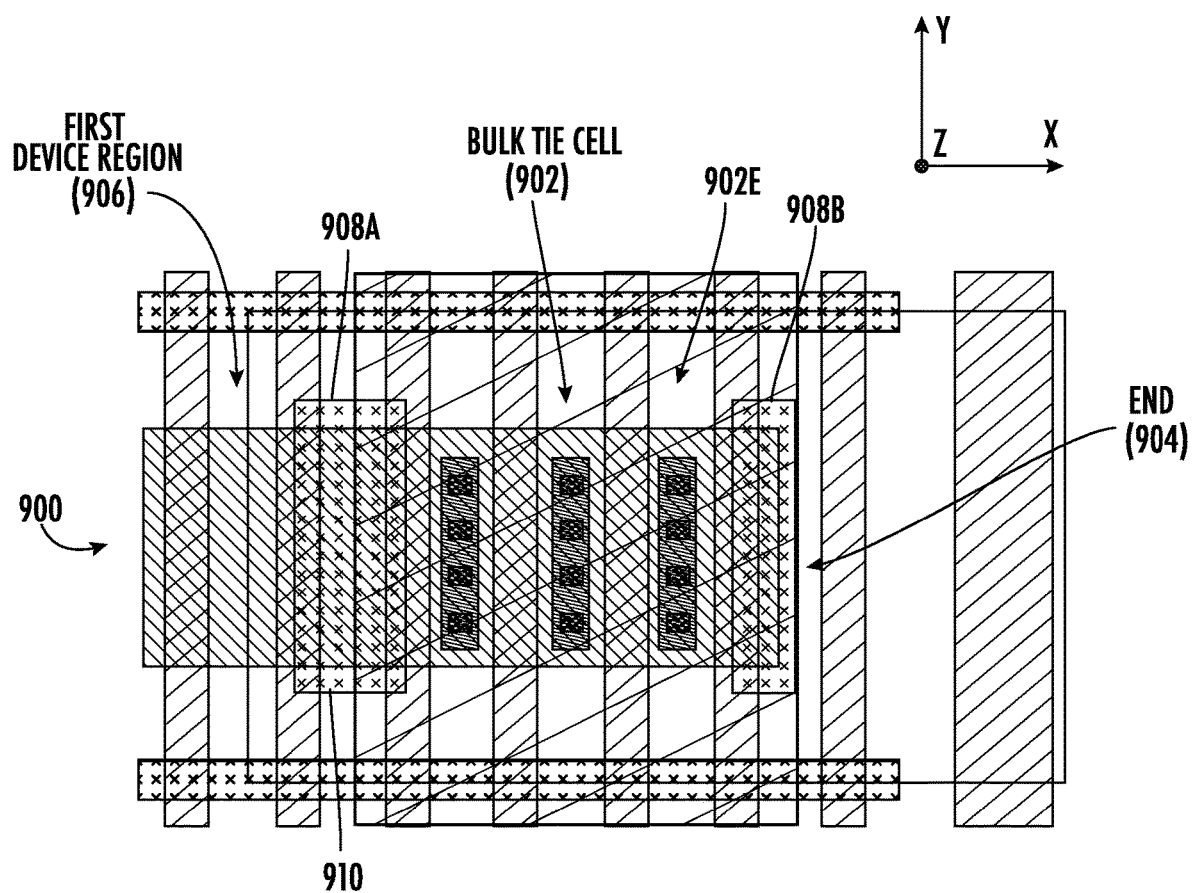
FIG. 9 is a detailed illustration of a top view of an exemplary bulk tie cell at an end of a diffusion region for reducing area of a MOS device array.

FIG. 9 is an illustration of a top view of an array diffusion region 900 including a bulk tie cell 902 at an end 904 (i.e., in the X-axis direction) of the array diffusion region. In this regard, the bulk tie cell 902 may be referred to as an end tie cell 902E. The array diffusion region 900 also includes a first device region 906. A first diffusion cut 908A on a first side of the bulk tie cell 902 isolates the first device region 906 from the bulk tie cell 902. A second diffusion cut 908B is disposed on a second side of the bulk tie cell 902 on an oxide layer 910 outside the array diffusion region 900. The array diffusion region 900 in FIG. 9 does not include a second device region. The end tie cell 902E may be formed at one or both ends 904 of respective array diffusion regions 900 in MOS device arrays.

Figure 10:
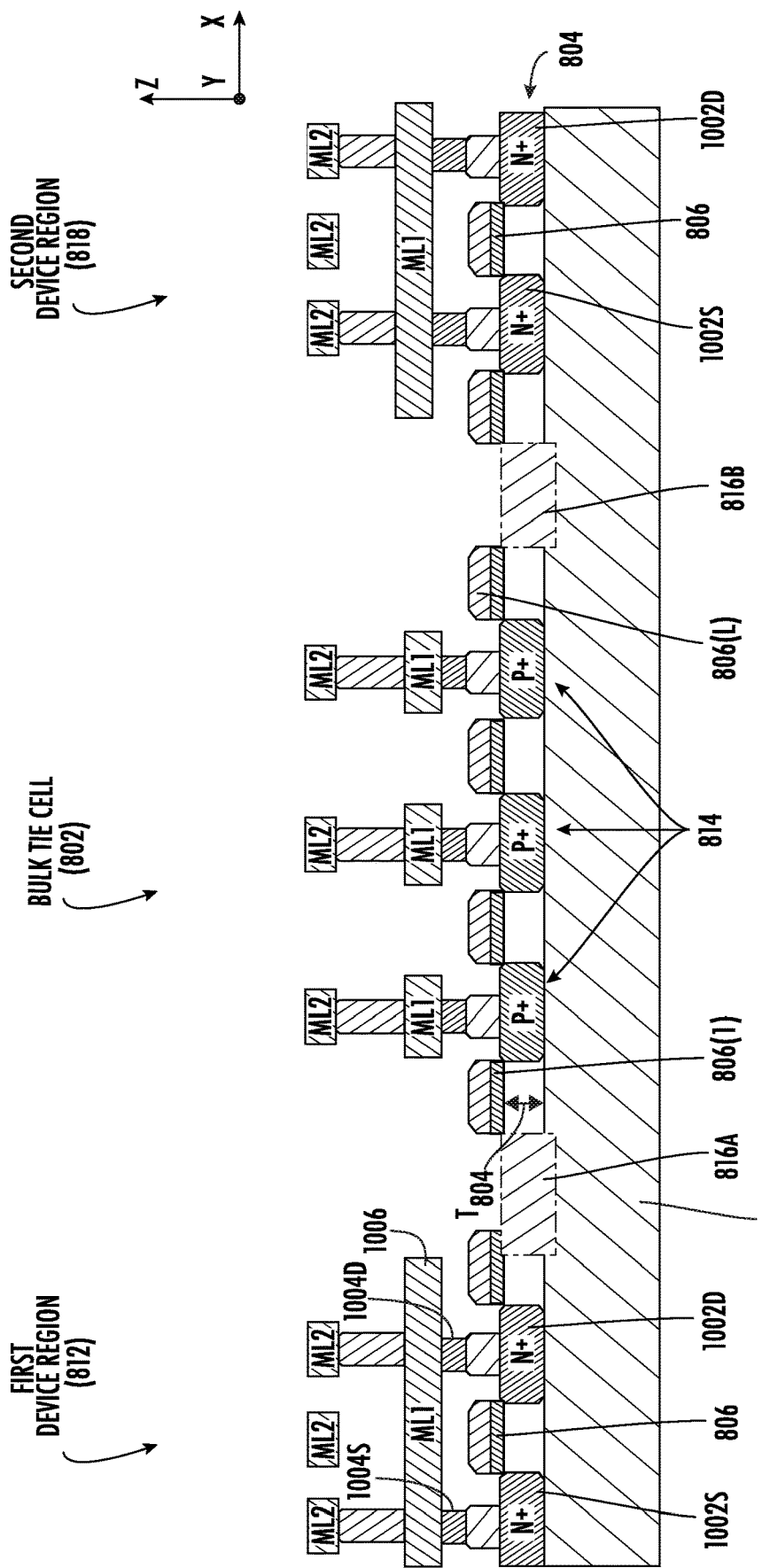
FIG. 10 is an illustration of a first cross-sectional side view of the array diffusion region including an exemplary bulk tie cell as shown in FIG. 8 through a metal conductor in a first metal layer coupled to the diffusion region of MOS devices.
Figure 11:
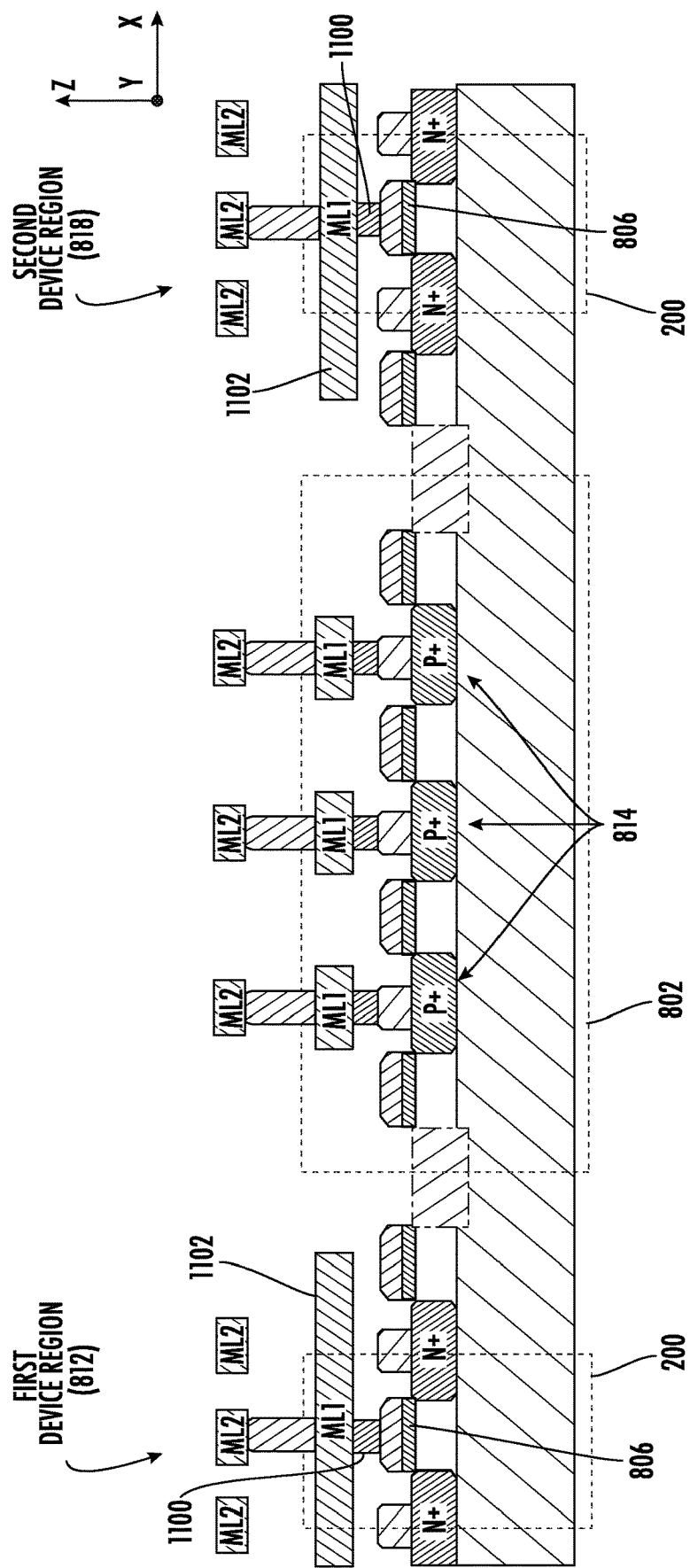
FIG. 11 is an illustration of a first cross-sectional side view of the diffusion region including an exemplary bulk tie cell as shown in FIG. 8 through a metal conductor in a first metal layer coupled to the polysilicon gates of MOS devices.

FIG. 10 is an illustration of a cross-sectional side view of the MOS device array circuit 800 at line AA in FIG. 8. FIG. 10 is provided to show details of the first device region 812, the bulk tie cell 802, and the second device region 818 in which the MOS devices 808 are MOSCAP cell circuits 200 as shown in FIGS. 2-4. Specifically, a source 1002S and a drain 1002D are coupled to the first metal layer ML1. Here, the semiconductor substrate 810 is lightly doped to a P-type and the array diffusion region 804 is an N-type region (e.g., under the gates 806) where N-type is the first dopant type. Thus, source 1002S and drain 1002D include heavily doped N-type layers on either side of the gates 806 in the first and second device regions 812 and 818. Vias 1004S and 1004D couple the source 1002S and the drain 1002D, respectively, to the metal conductor 1006 in the first metal layer ML1.

The array diffusion region 804 transitions from the first device region 812 to the bulk tie cell 802 at the first diffusion cut 816A which is formed between a gate 806 on the first device region 812 and the first gate 806(1) on the bulk tie cell 802. The array diffusion region 804 transitions back from the bulk tie cell 802 to the second device region 818 at the second diffusion cut 816B which is formed between a gate 806 on the second device region 818 and the last gate 806(L) on the bulk tie cell 802.

The bulk tie cell 802 includes three (3) bulk ties 814 each disposed between one of the gates 806 from the first gate 806(1) on the bulk tie cell 802 to the last gate 806(L). Although this example shows three bulk ties 814 and two gates 806 between the first gate 806(1) and the last gate 806(L), the bulk tie cell 802 is not limited in this regard. The bulk ties 814 each include the second type of doping, which is P+ in this example. In view of the bulk region 810B of the semiconductor substrate 810 being P-type, the bulk ties 814 provide a connection to the bulk region 810B. The bulk ties 814 are coupled together at the second layer of metal ML2 in this example but may be coupled at the first metal layer ML1 or another metal layer not shown.

FIG. 11 is an illustration of a cross-sectional side view of the MOS device array 800 at line BB in FIG. 8. FIG. 11 is provided to show details of the first device region 812 and the second device region 818 in which the MOS devices 808 are MOSCAP cell circuits 200 as shown in FIGS. 2-4. In particular, the cross-section at line BB in FIG. 1 illustrates connections by vias 1100 from the gates 806 to respective metal conductors 1102 in the first metal layer ML1 in the first device region 812 and the second device region 818 for respective MOSCAPs 200 formed therein, for example. The metal conductor 1102 is not coupled to the array diffusion region 804. The bulk tie cell 802 and bulk ties 814 in FIG. 11 correspond to FIG. 10.

Figure 12:
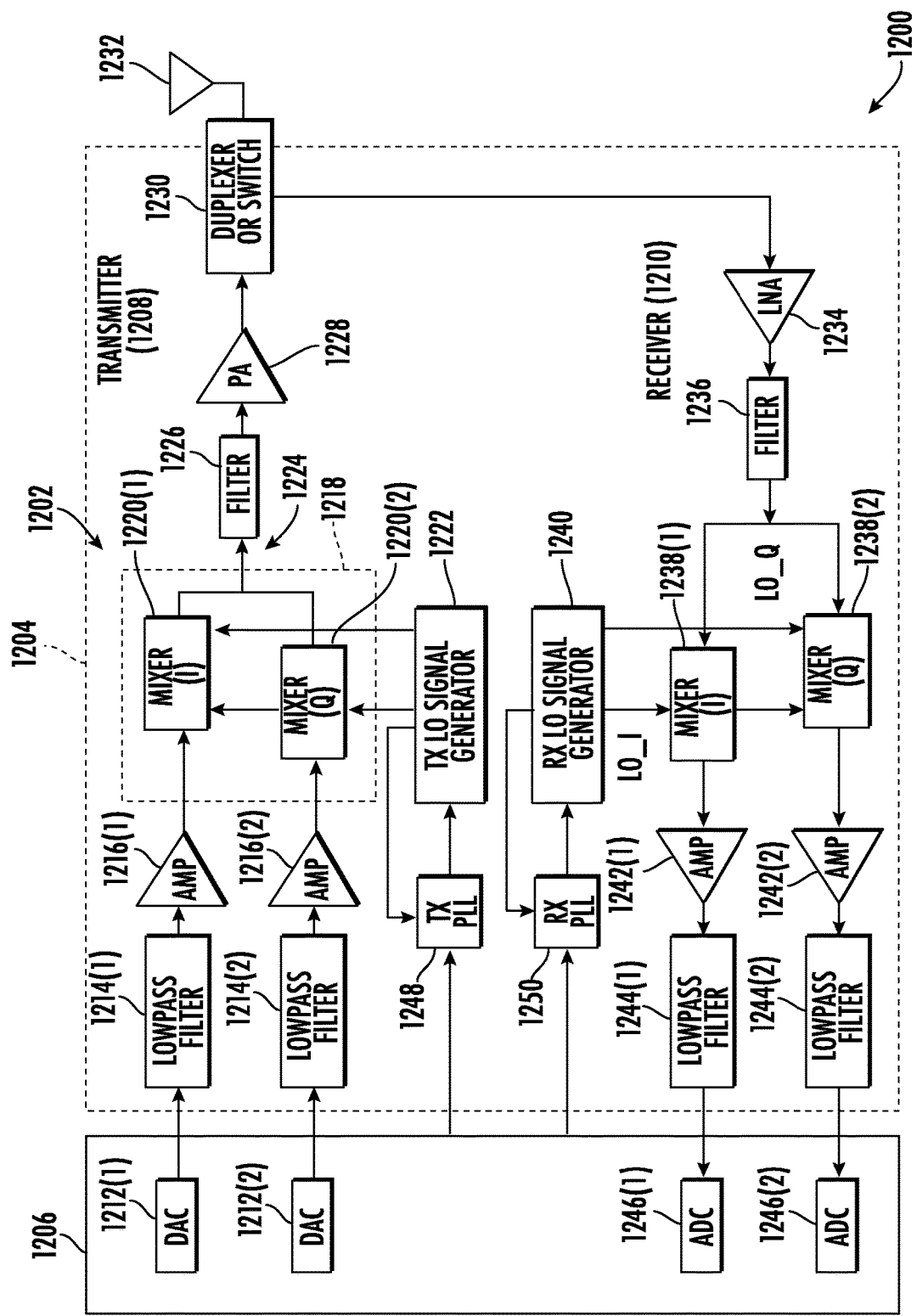
FIG. 12 is a block diagram of an exemplary wireless communications device that includes a radio frequency (RF) module including a high density MOS device array including the MOSCAP cell circuits of FIGS. 2-4 and the bulk tie cells in FIG. 8-11.

FIG. 12 illustrates an exemplary wireless communications device 1200 that includes radio-frequency (RF) components formed from one or more integrated circuits (ICs) 1102, wherein any of the ICs 1202 can include an exemplary high density MOS device array including MOSCAPs with cell regions and gates configured to increase capacitive density and bulk tie cells providing connections to the semiconductor bulk region within diffusion regions in MOS device arrays for increased MOS device array size and density, as illustrated in any of FIGS. 2-4 and 7-11, and according to any of the aspects disclosed herein. The wireless communications device 1200 may include or be provided in any of the above-referenced devices, as examples. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RFICs, mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals from a TX LO signal generator 1222 through mixers 1220(1), 1220(2) to provide an upconverted signal 1224. A filter 1226 filters the upconverted signal 1224 to remove undesired signals caused by the frequency upconversion as well as noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Down-conversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Wireless communications devices 1200 that each include an exemplary high density MOS device array including MOSCAPs with cell regions and gates configured to increase capacitive density and bulk tie cells providing connections to the semiconductor bulk region within diffusion regions in MOS device arrays for increased MOS device array size and density, as illustrated in any of FIGS.

2-4 and 7-11, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
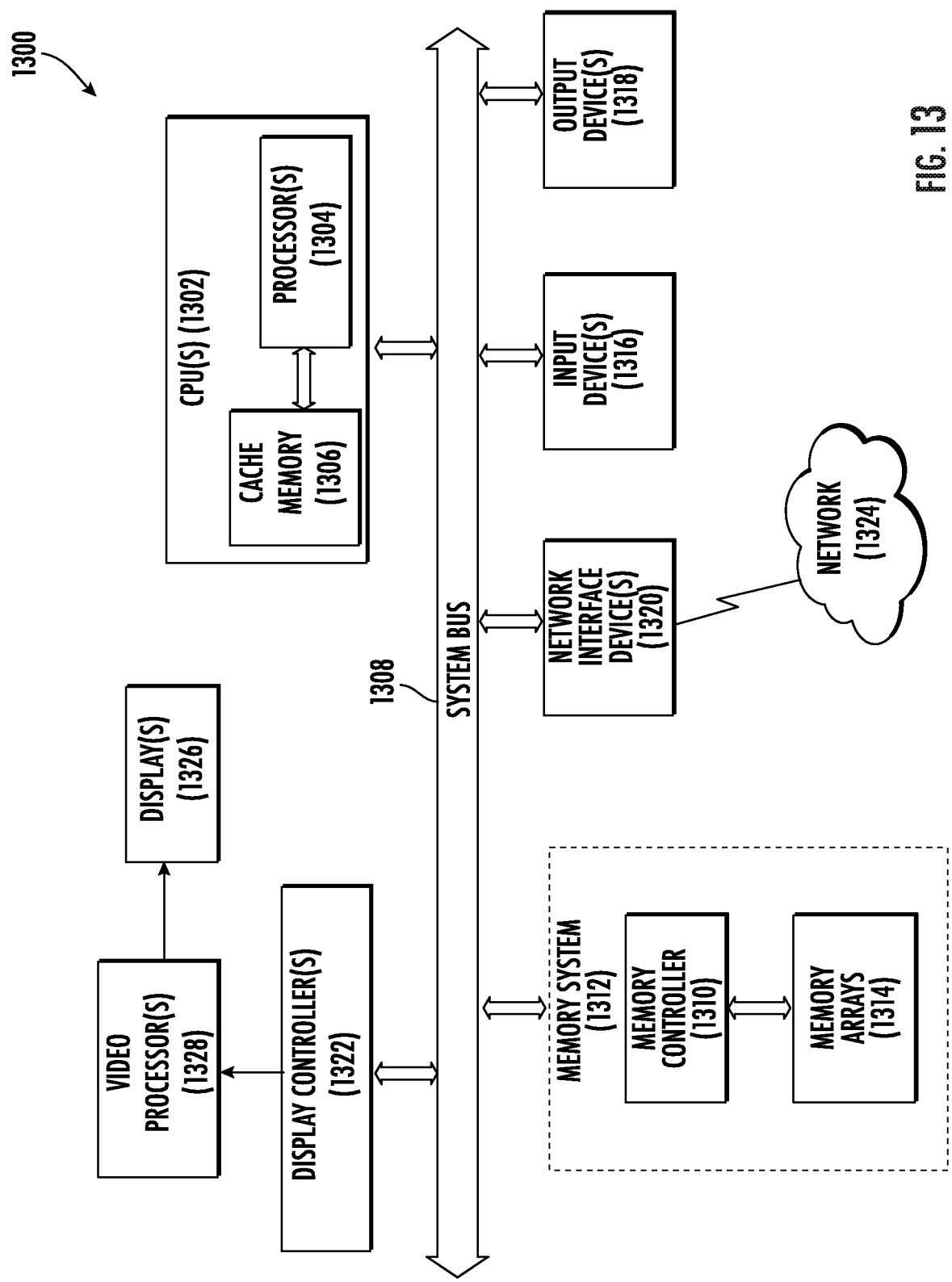
FIG. 13 is a block diagram of an exemplary IC package including a high density MOS device array including the MOSCAP cell circuits, as illustrated in FIGS. 2-4, and the bulk tie cells, as illustrated in FIGS. 8-11, and according to any of the aspects disclosed herein.

In this regard, FIG. 13 illustrates an example of a processor-based system 1300 including an exemplary high density MOS device array including MOSCAPs with cell regions and gates configured to increase capacitive density and bulk tie cells providing connections to the semiconductor bulk region within diffusion regions in MOS device arrays for increased MOS device array size and density, as illustrated in any of FIGS. 2-4 and 7-11, and according to any aspects disclosed herein. In this example, the processor-based system 1300 includes one or more central processor units (CPUs) 1302, which may also be referred to as CPU or processor cores, each including one or more processors 1304. The CPU(s) 1302 may have cache memory 1306 coupled to the processor(s) 1304 for rapid access to temporarily stored data. As an example, the processor(s) 1304 could include an exemplary high density MOS device array including MOSCAPs with cell regions and gates configured to increase capacitive density and bulk tie cells providing connections to the semiconductor bulk region within diffusion regions in MOS device arrays for increased MOS device array size and density, as illustrated in any of FIGS. 2-4 and 7-11, and according to any aspects disclosed herein. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312 that includes the memory controller 1310 and one or more memory arrays 1314, one or more input devices 1316, one or more output devices 1318, one or more network interface devices 1320, and one or more display controllers 1322, as examples. Each of the memory system 1312, the one or more input devices 1316, the one or more output devices 1318, the one or more network interface devices 1320, and the one or more display controllers 1322 can include an exemplary high density MOS device array including MOSCAPs with cell regions and gates configured to increase capacitive density and bulk tie cells providing connections to the semiconductor bulk region within diffusion regions in MOS device arrays for increased MOS device array size and density, as illustrated in any of FIGS. 2-4 and 7-11, and according to any of the aspects disclosed herein. The input device(s) 1316 can include any type of input device, including, but not limited to, input keys, switches, voice processors, etc. The output device(s) 1318 can include any type of output device, including, but not limited to, audio, video, other visual indicators, etc. The network interface device(s) 1320 can be any device configured to allow exchange of data to and from a network 1324. The network 1324 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1320 can be configured to support any type of communications protocol desired.

The CPU(s) 1302 may also be configured to access the display controller(s) 1322 over the system bus 1308 to control information sent to one or more displays 1326. The display controller(s) 1322 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc. The display controller(s) 1322, display(s) 1326, and/or the video processor(s) 1328 can include an exemplary high density MOS device array including MOSCAPs with cell regions and gates configured to increase capacitive density and bulk tie cells providing connections to the semiconductor bulk region within diffusion regions in MOS device arrays for increased MOS device array size and density, as illustrated in any of FIGS. 2-4 and 7-11, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A metal-oxide semiconductor (MOS) capacitor (MOSCAP) cell circuit, comprising:
   a semiconductor substrate;
   a cell region of the semiconductor substrate, the cell region comprising a region width extending in a first axis direction from a first region side to a second region side and a region length extending in a second axis direction, orthogonal to the first axis direction, from a first region end to a second region end;
   a diffusion region comprising an impurity disposed in the semiconductor substrate, the diffusion region extending from the first region side to the second region side of the cell region; and
   a gate disposed within the cell region on the semiconductor substrate, the gate comprising a gate width extending in the first axis direction from a first gate side to a second gate side and a gate length extending in the second axis direction from a first gate end to a second gate end;
   wherein the gate width is from 10% to 50% of the region width.

2. The MOSCAP cell circuit of clause 1, wherein the gate width is from 12% to 43% of the region width.

3. The MOSCAP cell circuit of clause 1 or 2, wherein the diffusion region comprises a width in the second axis direction from 40% to 80% of the region length.

4. The MOSCAP cell circuit of any one of clauses 1 to 3, wherein the region length is from eight (8) times the gate width to twelve (12) times the gate width.

5. The MOSCAP cell circuit of any one of clauses 1 to 4, further comprising a first metal conductor disposed in a first metal layer above the gate and extending in the first axis direction, wherein the first metal conductor couples to the diffusion region on a first side of the gate and on a second side of the gate.

6. The MOSCAP cell circuit of clause 5, further comprising a second metal conductor in the first metal layer above the gate and extending in the first axis direction, wherein the second metal conductor is coupled to the gate.

7. The MOSCAP cell circuit of any one of clauses 1 to 6, wherein:
   a source portion of the diffusion region is disposed between the first gate side and the first region side; and
   a drain portion of the diffusion region is disposed between the second gate side and the second region side.

8. The MOSCAP cell circuit of any one of clauses 1 to 7, wherein:
   the first gate end is separated from the first region end by a first gate cut region of the semiconductor substrate; and
   the second gate end is separated from the second region end by a second gate cut region of the semiconductor substrate.

9. The MOSCAP cell circuit of clause 6, further comprising:
   a third metal conductor extending in the second axis direction in a second metal layer on the semiconductor substrate, the third metal conductor coupled to the first metal conductor; and
   a fourth metal conductor extending in the second axis direction in the second metal layer on the semiconductor substrate, the fourth metal conductor coupled to the second metal conductor.

10. The MOSCAP cell circuit of clause 9, further comprising:
    a fifth metal conductor extending in the first axis direction in the first metal layer, the fifth metal conductor coupled to the diffusion region, wherein the second metal conductor is between the fifth metal conductor and the first metal conductor; and
    a sixth metal conductor extending in the first axis direction in the first metal layer, the sixth metal conductor coupled to the gate, wherein the fifth metal conductor is between the sixth metal conductor and the second metal conductor.

11. The MOSCAP cell circuit of clause 10, wherein the first metal conductor, the second metal conductor, the fifth metal conductor, and the sixth metal conductor are disposed directly above the gate.

12. The MOSCAP cell circuit of clause 5, further comprising:
    a first number of metal conductors in the first metal layer extending in the first axis direction and coupled to the diffusion region; and a corresponding first number of metal conductors in the first metal layer extending in the first axis direction and coupled to the gate;

wherein the first number of metal conductors coupled to the diffusion region and the corresponding first number of metal conductors coupled to the gate are disposed in alternating order in the second axis direction.

13. A metal-oxide semiconductor (MOS) capacitor (MOSCAP) array circuit comprising:
    a semiconductor substrate; and
    a plurality of MOSCAP cell circuits, each comprising:
        a cell region of the semiconductor substrate, the cell region comprising a region width extending in a first axis direction from a first region side to a second region side and a region length extending in a second axis direction, orthogonal to the first axis direction, from a first region end to a second region end;
        a diffusion region comprising an impurity disposed in the semiconductor substrate, the diffusion region extending from the first region side to the second region side of the cell region; and
        a gate disposed on the semiconductor substrate and within the cell region, the gate comprising a gate width extending in the first axis direction from a first gate side to a second gate side and a gate length extending in the second axis direction from a first gate end to a second gate end;
        wherein the gate width is from 10% to 50% of the region width.

14. The MOSCAP array circuit of clause 13, each of the plurality of MOSCAP cell circuits further comprising a first metal conductor extending in the first axis direction, the first metal conductor coupled to the diffusion region on a first side of the gate and coupled to the diffusion region on a second side of the gate, the first metal conductor comprising a first portion of a first metal layer on the semiconductor substrate.

15. The MOSCAP array circuit of clause 13 or 14, wherein the plurality of MOSCAP cell circuits comprises:
    a first plurality of MOSCAP cell circuits comprising respective cell regions abutted side by side in a row extending in the first axis direction; and
    a second plurality of MOSCAP cell circuits comprising respective cell regions abutted end to end in a column in the second axis direction.

16. The MOSCAP array circuit of clause 15, wherein a distance in the second axis direction between a first gate of a first MOSCAP cell circuit in a first row and a second gate of a second MOSCAP cell circuit in a second row is less than the gate width.

17. The MOSCAP array circuit of any one of clauses 13 to 16, integrated into a radio-frequency (RF) front end module.

18. The MOSCAP array circuit of any one of clauses 13 to 17 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A metal-oxide semiconductor (MOS) device array circuit comprising:
    a semiconductor substrate comprising a surface and a bulk region;
    an array diffusion region comprising a first type of dopant in the surface of the semiconductor substrate, the array diffusion region extending along a longitudinal axis in a first axis direction and comprising a first device region and a bulk tie cell;
    at least one MOS device in the first device region;
    at least one bulk tie disposed in the bulk tie cell and connected to the bulk region of the semiconductor substrate;
    a plurality of gates disposed on the semiconductor substrate and extending in a second axis direction, orthogonal to the first axis direction, above the array diffusion region and separated from each other in the first axis direction according to a gate pitch; and
    a first diffusion cut disposed in the surface of the semiconductor substrate on a first side of the bulk tie cell between a first gate on the first device region and a second gate on the bulk tie cell, the diffusion cut electrically isolating the bulk tie cell from the first device region.

20. The MOS device array circuit of clause 19, wherein:
    the array diffusion region further comprises the first type of dopant disposed to a diffusion thickness in the surface of the semiconductor substrate; and
    the at least one bulk tie comprises a second type of dopant extending through the diffusion thickness and coupled to the bulk region.

21. The MOS device array circuit of clause 19 or 20, further comprising a second diffusion cut on a second side of the bulk tie cell between a last gate in the first axis direction on the bulk tie cell and a next gate.

22. The MOS device array circuit of clause 21, wherein:
    the array diffusion region further comprises a second device region comprising at least one MOS device;
    the next gate is disposed on the second device region; and
    the second diffusion cut electrically isolates the bulk tie cell from the second device region.

23. The MOS device array circuit of clause 21, wherein:
    the bulk tie cell comprises an end tie cell at an end of the array diffusion region in the first axis direction; and
    the next gate is disposed on an oxide layer.

24. The MOS device array circuit of clause 21, wherein the at least one bulk tie comprises:
    a first bulk tie between the second gate on the bulk tie cell and another gate of the plurality of gates on the bulk tie cell; and
    the another gate of the plurality of gates comprises the last gate of the plurality of gates in the first axis direction on the bulk tie cell.

25. The MOS device array circuit of clause 21, wherein the at least one bulk tie comprises:
    a first bulk tie between the second gate on the bulk tie cell and another gate of the plurality of gates on the bulk tie cell; and
    one or more additional bulk ties consecutively disposed between consecutive gates on the bulk tie cell from the another gate to the last gate in the first axis direction on the bulk tie cell.

26. The MOS device array circuit of any one of clauses 19 to 25, wherein the at least one MOS device comprises MOS capacitors (MOSCAPs).

27. The MOS device array circuit of any one of clauses 19 to 25, wherein the at least one MOS device comprises MOS transistors.

28. The MOS device array circuit of any one of clauses 19 to 27, wherein the at least one bulk tie is coupled to the at least one MOS device disposed in the first device region.

29. The MOS device array circuit of any one of clauses 19 to 28, wherein the first diffusion cut comprises an oxide layer disposed between the first device region and the bulk tie cell.

What is claimed is:

1. A metal-oxide semiconductor (MOS) capacitor (MOSCAP) cell circuit, comprising:
   a semiconductor substrate;
   a cell region of the semiconductor substrate, the cell region comprising a region width extending in a first axis direction from a first region side to a second region side and a region length extending in a second axis direction, orthogonal to the first axis direction, from a first region end to a second region end;
   a diffusion region comprising an impurity disposed in the semiconductor substrate, the diffusion region extending from the first region side to the second region side of the cell region;
   a gate disposed within the cell region on the semiconductor substrate, the gate comprising a gate width extending in the first axis direction from a first gate side to a second gate side and a gate length extending in the second axis direction from a first gate end to a second gate end, wherein the gate width is from 10% to 50% of the region width;
   a first metal conductor in a first metal layer above the gate and extending in the first axis direction, wherein the first metal conductor electrically couples to the diffusion region on a first side of the gate and on a second side of the gate; and
   a second metal conductor in the first metal layer above the gate and extending in the first axis direction, wherein the second metal conductor is electrically coupled to the gate.

2. The MOSCAP cell circuit of claim 1, wherein the gate width is from 12% to 43% of the region width.

3. The MOSCAP cell circuit of claim 1, wherein the diffusion region comprises a width in the second axis direction from 40% to 80% of the region length.

4. The MOSCAP cell circuit of claim 1, wherein the region length is from eight (8) times the gate width to twelve (12) times the gate width.

5. The MOSCAP cell circuit of claim 1, wherein:
   a source portion of the diffusion region is disposed between the first gate side and the first region side; and
   a drain portion of the diffusion region is disposed between the second gate side and the second region side.

6. The MOSCAP cell circuit of claim 1, wherein:
   the first gate end is separated from the first region end by a first gate cut region of the semiconductor substrate; and
   the second gate end is separated from the second region end by a second gate cut region of the semiconductor substrate.

7. The MOSCAP cell circuit of claim 1, further comprising:
   a third metal conductor extending in the second axis direction in a second metal layer on the semiconductor substrate, the third metal conductor coupled to the first metal conductor; and
   a fourth metal conductor extending in the second axis direction in the second metal layer on the semiconductor substrate, the fourth metal conductor coupled to the second metal conductor.

8. The MOSCAP cell circuit of claim 7, further comprising:
   a fifth metal conductor extending in the first axis direction in the first metal layer, the fifth metal conductor coupled to the diffusion region, wherein the second metal conductor is between the fifth metal conductor and the first metal conductor; and
   a sixth metal conductor extending in the first axis direction in the first metal layer, the sixth metal conductor coupled to the gate, wherein the fifth metal conductor is between the sixth metal conductor and the second metal conductor.

9. The MOSCAP cell circuit of claim 8, wherein the first metal conductor, the second metal conductor, the fifth metal conductor, and the sixth metal conductor are disposed directly above the gate.

10. The MOSCAP cell circuit of claim 1, further comprising:
    a first number of metal conductors in the first metal layer extending in the first axis direction and coupled to the diffusion region; and
    a corresponding first number of metal conductors in the first metal layer extending in the first axis direction and coupled to the gate;
    wherein the first number of metal conductors coupled to the diffusion region and the corresponding first number of metal conductors coupled to the gate are disposed in alternating order in the second axis direction.

11. A metal-oxide semiconductor (MOS) capacitor (MOSCAP) array circuit comprising:
    a semiconductor substrate; and
    a plurality of MOSCAP cell circuits, each comprising:
      a cell region of the semiconductor substrate, the cell region comprising a region width extending in a first axis direction from a first region side to a second region side and a region length extending in a second axis direction, orthogonal to the first axis direction, from a first region end to a second region end;
      a diffusion region comprising an impurity disposed in the semiconductor substrate, the diffusion region extending from the first region side to the second region side of the cell region;
      a gate disposed on the semiconductor substrate and within the cell region, the gate comprising a gate width extending in the first axis direction from a first gate side to a second gate side and a gate length extending in the second axis direction from a first gate end to a second gate end, wherein the gate width is from 10% to 50% of the region width;
      a first metal conductor extending in the first axis direction, the first metal conductor electrically coupled to the diffusion region on a first side of the gate and electrically coupled to the diffusion region on a second side of the gate, the first metal conductor comprising a first portion of a first metal layer on the semiconductor substrate; and a second metal conductor of the first metal layer extending in the first axis direction, wherein the second metal conductor is electrically coupled to the gate.

12. The MOSCAP array circuit of claim 11, wherein the plurality of MOSCAP cell circuits comprises:
a first plurality of MOSCAP cell circuits comprising respective cell regions abutted side by side in a row extending in the first axis direction; and
a second plurality of MOSCAP cell circuits comprising respective cell regions abutted end to end in a column in the second axis direction.

13. The MOSCAP array circuit of claim 12, wherein a distance in the second axis direction between a first gate of a first MOSCAP cell circuit in a first row and a second gate of a second MOSCAP cell circuit in a second row is less than the gate width.

14. The MOSCAP array circuit of claim 11, integrated into a radio-frequency (RF) front end module.

15. The MOSCAP array circuit of claim 11 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A metal-oxide semiconductor (MOS) device array circuit comprising:
a semiconductor substrate comprising a surface and a bulk region;
an array diffusion region comprising a first type of dopant in the surface of the semiconductor substrate, the array diffusion region extending along a longitudinal axis in a first axis direction and comprising a first device region and a bulk tie cell;
at least one MOS device in the first device region;
at least one bulk tie disposed in the bulk tie cell and connected to the bulk region of the semiconductor substrate;
a plurality of gates disposed on the semiconductor substrate and extending in a second axis direction, orthogonal to the first axis direction, above the array diffusion region and separated from each other in the first axis direction according to a gate pitch; and
a first diffusion cut disposed in the surface of the semiconductor substrate on a first side of the bulk tie cell between a first gate on the first device region and a second gate on the bulk tie cell, the first diffusion cut electrically isolating the bulk tie cell from the first device region.

17. The MOS device array circuit of claim 16, wherein:
the array diffusion region further comprises the first type of dopant disposed to a diffusion thickness in the surface of the semiconductor substrate; and
the at least one bulk tie comprises a second type of dopant extending through the diffusion thickness and coupled to the bulk region.

18. The MOS device array circuit of claim 16, further comprising a second diffusion cut on a second side of the bulk tie cell between a last gate in the first axis direction on the bulk tie cell and a next gate.

19. The MOS device array circuit of claim 18, wherein:
the array diffusion region further comprises a second device region comprising at least one MOS device;
the next gate is disposed on the second device region; and
the second diffusion cut electrically isolates the bulk tie cell from the second device region.

20. The MOS device array circuit of claim 18, wherein:
the bulk tie cell comprises an end tie cell at an end of the array diffusion region in the first axis direction; and
the next gate is disposed on an oxide layer.

21. The MOS device array circuit of claim 18, wherein the at least one bulk tie comprises:
a first bulk tie between the second gate on the bulk tie cell and another gate of the plurality of gates on the bulk tie cell; and
the another gate of the plurality of gates comprises the last gate of the plurality of gates in the first axis direction on the bulk tie cell.

22. The MOS device array circuit of claim 18, wherein the at least one bulk tie comprises:
a first bulk tie between the second gate on the bulk tie cell and another gate of the plurality of gates on the bulk tie cell; and
one or more additional bulk ties consecutively disposed between consecutive gates on the bulk tie cell from the another gate to the last gate in the first axis direction on the bulk tie cell.

23. The MOS device array circuit of claim 16, wherein the at least one MOS device comprises MOS capacitors (MOSCAPs).

24. The MOS device array circuit of claim 16, wherein the at least one MOS device comprises MOS transistors.

25. The MOS device array circuit of claim 16, wherein the at least one bulk tie is coupled to the at least one MOS device disposed in the first device region.

26. The MOS device array circuit of claim 16, wherein the first diffusion cut comprises an oxide layer disposed between the first device region and the bulk tie cell.

* * * * *